(12) United States Patent
Rehm

(10) Patent No.: US 10,079,512 B2
(45) Date of Patent: Sep. 18, 2018

(54) LARGE SIGNAL VCO

(71) Applicant: Markus Rehm, Villingen-Schwenningen (DE)

(72) Inventor: Markus Rehm, Villingen-Schwenningen (DE)

(*) Notice: Subject to any disclaimer, the term of this patent is extended or adjusted under 35 U.S.C. 154(b) by 197 days.

(21) Appl. No.: 15/259,373

(22) Filed: Sep. 8, 2016

(65) Prior Publication Data

US 2016/0380483 A1     Dec. 29, 2016

Related U.S. Application Data

(62) Division of application No. 14/592,343, filed on Jan. 8, 2015, now Pat. No. 9,479,112, which is a division
(Continued)

(30) Foreign Application Priority Data

Apr. 4, 2011 (DE) ................... 10 2011 016 027

(51) Int. Cl.
   *H02J 50/12*        (2016.01)
   *H02J 50/40*        (2016.01)
(Continued)

(52) U.S. Cl.
   CPC ............... *H02J 50/12* (2016.02); *H02J 7/025* (2013.01); *H02J 17/00* (2013.01); *H02J 50/40* (2016.02);
(Continued)

(58) Field of Classification Search
   CPC ..................................................... H02J 50/12
(Continued)

(56) References Cited

U.S. PATENT DOCUMENTS

| | | | |
|---|---|---|---|
| 4,438,386 A | 3/1984 | Gyugyi |
| 6,586,895 B2 | 7/2003 | Weber |
| (Continued) | | |

FOREIGN PATENT DOCUMENTS

| | | | |
|---|---|---|---|
| GB | 2433381 A | 6/2007 |
| GB | 2467931 A | 8/2010 |
| (Continued) | | |

OTHER PUBLICATIONS

Stabilizing the Operation Frequency of a Resonant Converter for Wireless Power Transfer to Implantable Biomedical Sensors. 1st International Conference on Sensing Technology, Nov. 21-23, 2005 Palmer North, New Zealand.
(Continued)

*Primary Examiner* — Joseph Chang
(74) *Attorney, Agent, or Firm* — Jack Schwartz & Associates, PLLC

(57) ABSTRACT

An alternation voltage- or current generator comprises a first switch driving output network whose frequency can be tuned. The tunable network comprises a first Inductor that is coupled with a first capacitor. A second inductor and/or at least a second capacitor and/or at least a series circuit of a third inductor and a third capacitor which is coupled via at a second switch to the network. The second switch is controlled by a controlled delay (PWM) which is synchronized by a sign change of current and/or voltage in the network.

23 Claims, 15 Drawing Sheets

Related U.S. Application Data of application No. 13/506,095, filed on Mar. 27, 2012, now Pat. No. 8,963,514.

(51) Int. Cl.
*H02J 17/00* (2006.01)
*H02M 3/338* (2006.01)
*H03B 5/12* (2006.01)
*H04B 5/00* (2006.01)
*H03L 7/099* (2006.01)
*H03B 5/08* (2006.01)
*H02J 7/02* (2016.01)
*H02M 7/48* (2007.01)

(52) U.S. Cl.
CPC .......... *H02M 3/3387* (2013.01); *H02M 7/48* (2013.01); *H03B 5/08* (2013.01); *H03B 5/1218* (2013.01); *H03B 5/1268* (2013.01); *H03L 7/099* (2013.01); *H04B 5/0037* (2013.01); *H02M 2007/4815* (2013.01); *H03J 2200/15* (2013.01); *Y02B 70/1433* (2013.01); *Y02B 70/1441* (2013.01)

(58) Field of Classification Search
USPC .......................................................... 307/104
See application file for complete search history.

(56) References Cited

U.S. PATENT DOCUMENTS

| 8,446,046 | B2 | 5/2013 | Fells et al. |
| 2003/0231039 | A1 | 12/2003 | Locke |
| 2008/0211478 | A1 | 9/2008 | Hussman et al. |
| 2009/0080101 | A1* | 3/2009 | Lee .......... H03L 7/081 360/51 |

FOREIGN PATENT DOCUMENTS

| WO | 2006132570 A1 | 12/2006 |
| WO | 2011001168 A1 | 1/2011 |

OTHER PUBLICATIONS

Thyristor-Contolled Single Phase Variable Inductor. Sen et al., BD. MAG-3, NR.3, Sep. 1, 1967, pp. 240-245, XP001604318.

\* cited by examiner

Prior art
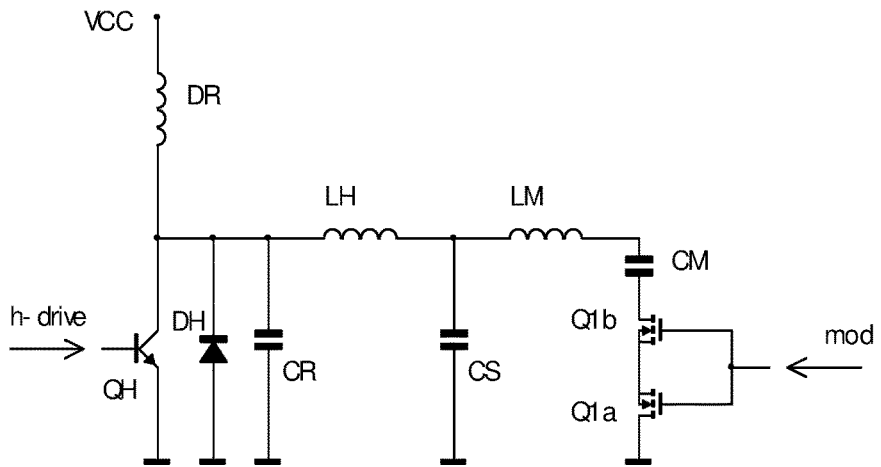
Fig.1
Prior art
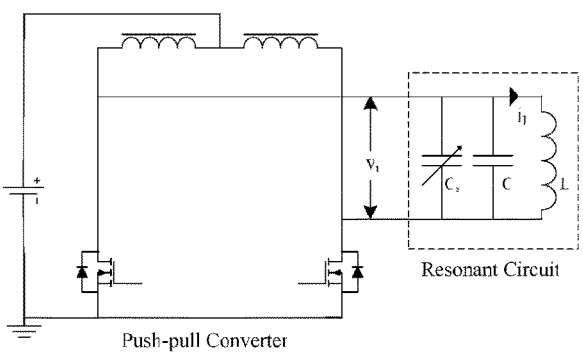
Fig.2A
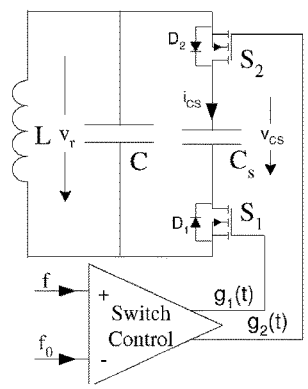
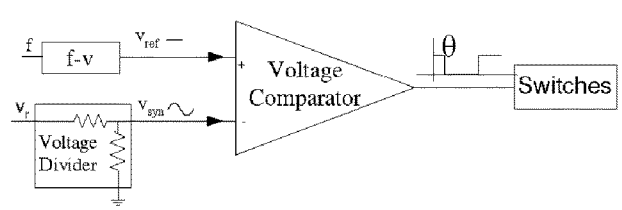
Fig. 2B          Fig. 2C

LARGE SIGNAL VCO

FIELD OF THE INVENTION

The present invention relates to the generation of electromagnetic waves by means of resonant network and more particularly to near field power transmission for RFID and wireless power supplies. Furthermore, the current invention relates to control the resonant frequency of an oscillator by means of a switched resonant network.

BACKGROUND OF THE INVENTION

Wireless power supplies can be realized by means of inductive and/or capacitive near-field coupling. This is used in many RFID systems and wireless battery chargers. A source unit, hereinafter referred to as the base station, generates an electromagnetic alternating field whose radiation unit represents a resonant circuit. By means of such a resonant circuit the alternating field is produced efficiently at relatively low cost, because the driver circuits generate virtually no switching losses (ZVS zero voltage or zero current switching ZCS). The filtering effect of the resonant circuit influences the spectral power density and suppresses harmonics. A generator in the base station drives the resonant circuit with a signal whose frequency and amplitude can be varied to control the transmitted power.

The designated energy equipment to be supplied, hereinafter referred to as the load unit is placed at a distance of a fraction of the wavelength of the alternating electromagnetic field so that the coupling condition between the base station and the load unit becomes optimal. This is achieved by the same polarization, minimum distance and greatest coupling surface. Often, additional soft magnetic materials are used in order to further increase the coupling and/or to direct the field profile.

It is known, that the transmitted power at a given coupling factor can be increased by the use of a resonant circuit in the load unit. Optimally, the load resonant circuit shall be tuned exactly to the frequency of the generated alternating magnetic field, where one has to weight achievable coupling gain versus resulting bandwidth.

In "System description Wireless Power Transfer", a resonant circuit is shown, which is driven by a generator.

Therein, in a resonant circuit a plurality of inductances are added by switches to the resonant circuit to concentrate the radiated field energy to an area where load units are positioned. Additionally, an upstream voltage or current regulator controls the power supply.

The general disadvantage of wireless power transfer principles using resonant circuits in the base station and/or in the load unit is the resonance frequency detuning. This has been due to component tolerances, component aging, variable coupling and load conditions. This load detuning is undesirable because the impedance of the resonant circuit is frequency selective and a predetermined operating frequency no longer matches the resonant frequency. Consequently the overall efficiency of the driver circuit decreases and thus the power transmission from base station to the load unit. In addition the drive waveforms become more distorted and the driver circuits generate more harmonics.

The well-known network measurement method measures while in an interval, the resonant frequency of the network and then it operates at this frequency, but has no ability to control the network frequency actively. This would be very desirable, because regulations such as EN300330, ITU-REC7003 and RSM2123 specify maximal amplitude values for given frequency ranges (for example 119 . . . 135 kHz). Furthermore country-specific narrow band frequencies exist within a given frequency range which define much smaller limiting values.

Therefore, it is important to control not only the power but also the spectral position of the radiated power.

U.S. Pat. No. 6,586,895 shows how to control an inductor or a higher order network using a variable coupling interval during both half waves of a resonant circuit period.

FIG. 1 shows the main circuit wherein the capacitor CS and the inductance LH form a series resonant circuit. The capacitor CM and the inductor LM are both coupled via the controlled transistors Q1$a$ and Q1$b$ and their integrated body diodes to CS in two part-intervals of the resonant circuit period. The coupling control operates in both half cycles of the resonant circuit period, since the current in CM and LM depends in both directions from the control of the transistors Q1$a$ respectively Q1$b$. The capacitor CR is not relevant, because it remains short-circuited by the transistor QH and diode DH, or the transistors Q1$a$ and Q1$b$ remain fully open or fully closed when QH is open.

In "Stabilisation the Operating Frequency of a Resonant Converter for Wireless Power transfer to Implantable Biomedical Sensors" a controlled resonant network is proposed in a generator, wherein the load resonant circuit can be controlled by a variable coupling interval (see FIG. 2$a$). In an LC resonant circuit, a second capacitor is coupled for sub-intervals of the resonant circuit period to the LC resonant circuit (see FIG. 2$b$). The switch control compares the resonant circuit voltage versus a reference voltage which acts as a control variable and the comparator output represents the switching signal for the coupling switches (see FIG. 2$c$). This control method works very unreliable, since any change in the resonant circuit amplitude immediately interact with the frequency of the resonant circuit.

Coupled load units (respectively changing load conditions) alter the amplitude of the resonant circuit voltage. Also, often used amplitude control methods to control the power transfer, always result in frequency detuning. In fact, the amplitude control and the frequency control interact with each other, they cannot be controlled independently.

Generating control signals, which are dependent on the controlled output signal is very difficult. The main problem is, that an updated output value instantly changes the input value and thus makes the system unstable.

Another important requirement of a base station, whose frequency can be controlled, is the amplitude fidelity. The amplitude shall remain constant, when the frequency changes. This is especially difficult during the sudden step tuning (frequency hopping), because the impedance of the resonant circuit may vary greatly according to the frequency tuning step size.

In a tunable resonant circuit using controlled interval coupling for its component variation, it is very vital that the coupling interval can be controlled independently from the resonant circuit period and amplitudes.

This means the resonant circuit frequency is only a function of a control variable. This independence condition ensures stable operation regardless of the quality of the response network. Frequency or phase locked loops should preferably have a short lock time. Thereby, frequency or phase changes in the network are immediately corrected. In addition, a fast control loop is important to manage in a sweep operation an operating frequency range with large time resolution (short residence time).

The following invention describes a method and their detailed implementations to control the frequency or phase of a generator via controlled large signal network. The following invention describes a method that meets all requirements above and is characterized by a short lock time, quality independent stable operation and high efficiency.

SUMMARY OF THE INVENTION

In a first aspect of the present invention, a wireless power supply circuit is proposed, which controls the resonance frequency of an LC resonant circuit electronically. A capacitance, inductance or combined arrangements of both are coupled by means of electronic switches to the network during a part interval of the resonant circuit period. A pair of additional switches is coupled to the LC resonant circuit to generate a continuous wave.

In another aspect of the invention, the pair of switches, which generates a continuous wave in the resonant circuit, forms an oscillator.

SHORT DESCRIPTION OF DRAWINGS

FIG. 1 shows a circuit to control the frequency of a large signal network according to a first prior art.

FIGS. 2A, 2B and 2C show circuits to control the frequency of a large signal network according to a second prior art.

DETAILED DESCRIPTION OF THE INVENTION

Figure 3:
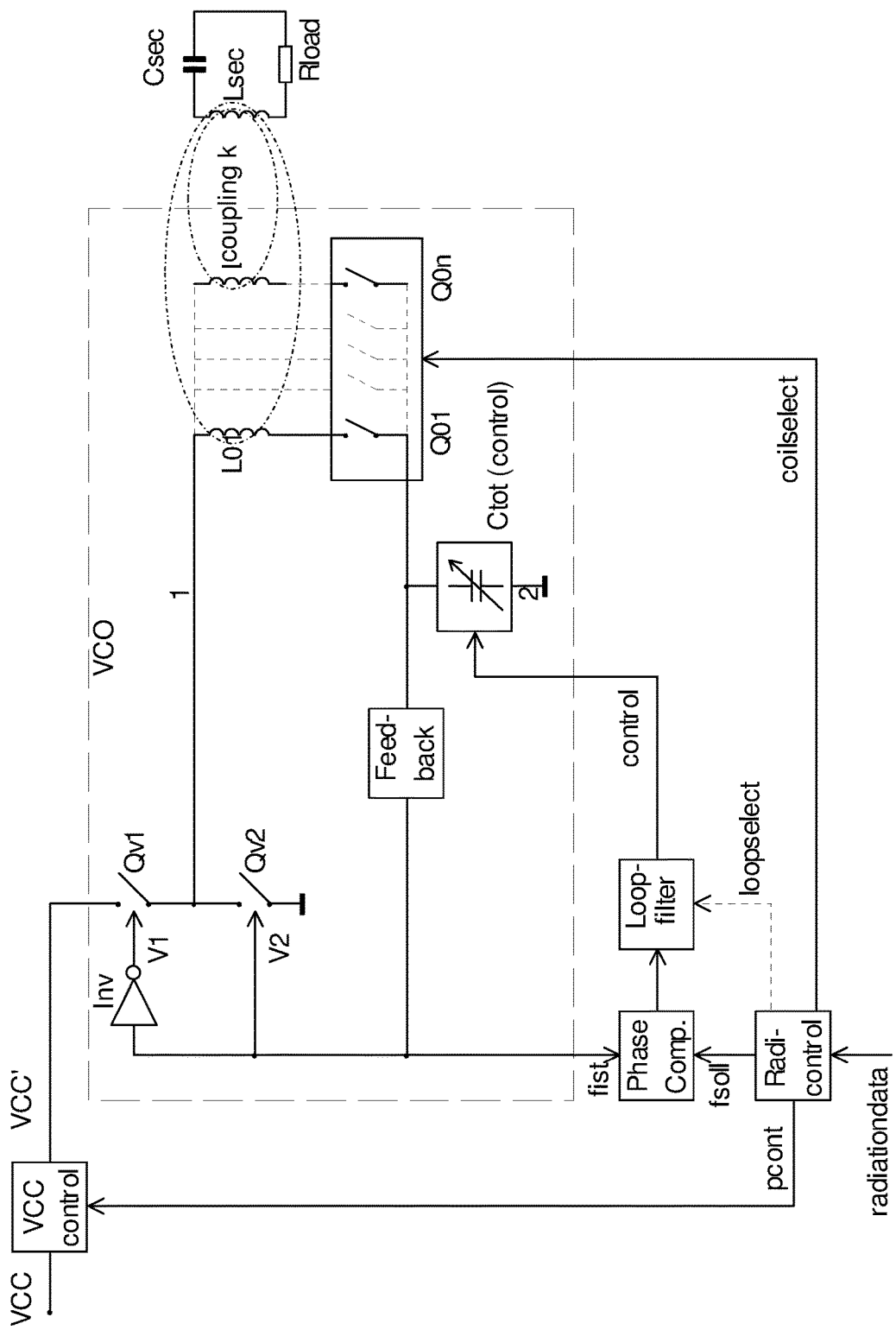
FIG. 3 shows a block diagram of a large signal VCO according to a first exemplary embodiment of the invention.

The block diagram of a series push-pull oscillator with a controlled capacitor in the resonant network shown in FIG. 3 according to a first embodiment. Herein, this oscillator is used as a base station in a wireless power supply system, but it can be used as any oscillator. The switches Qv1 and Qv2 form a series push-pull stage (half bridge), which couples its center alternately either to VCC' or to a reference potential (ground). The switches Qv1 and Qv2 are alternately open or closed. In one embodiment, the switches Qv1 and Qv2 are of the same channel type (either two P-channel or two N-channel MOSFETs respectively either two PNP or two NPN IGBTs). The opposite-phase drive signals V1 and V2 are guaranteed by the inverter (Inv). In another embodiment, the switches Qv1 and Qv2 are of complementary types (P/N channel MOSFETs or PNP/NPN bipolar transistors or IGBTs), there Inv is not implemented. The center tap of the switches is connected to a series resonant circuit consisting of one or more inductors $L01 \ldots L0n$ and one or more controlled capacities Ctot with a reference potential (ground). At least one inductor L01 is part of the resonant circuit. If additional multiple inductors are used, any number of them are coupled via switches $Q01 \ldots Q0n$ to the resonant circuit. In any arbitrary branch $Q0n$, $L0n$ may be additional series inductors and their switches (not shown). These switches control the series inductor bypass. Such extended inductor circuitries may be required at high VCC', higher transmitted power and/or multiple load units.

A load unit comprises a load resistor (Rload), a pickup inductor (Lsec) and often, but not necessarily a capacitor Csec, that tunes the load unit's resonant frequency to match with the base station radiation field. Alternatively, a parallel resonant circuit can also be used in the load unit (not shown). The proper tuning to either series- or parallel resonance in the load unit is not critical, because the attenuation of Rload the increases the bandwidth significantly.

All or any number of the inductors $L01 \ldots L0n$ are implemented as an open coils and couple one or more load units to the resonant circuit of the base station. If multiple inductors $L01 \ldots L0n$ are used, they are positioned on a surface or on multiple surfaces which are at an angle to each other. Is the corresponding coupling switch $Q01 \ldots Q0n$ closed, the current in the corresponding inductance $L01 \ldots L0n$ generates an induction vector. Thus, the induction field can be distributed arbitrarily on a given area or a confined space. Advantageously in this way, the radiated induction field is concentrated on the geometrical positions of the load units. Therefore, merely those inductors $L01 \ldots L0n$ are coupled to the resonant network, which transferred power to the load units. If only one load unit is present, its coupling with the base station can be improved by coupling more inductors $L01 \ldots L0n$ to the resonant network. Alternatively, in one embodiment, only one permanent wired inductor L01 is used in the resonant network of the base station for power transmission. In the near field, the arrangement can be regarded as an open transformer whose coupling (coupling k) strongly varies with the geometric positioning and the distance from $L01 \ldots L0n$ to Lsec. A feedback closes a feedback loop from the resonant network to the switch input V1 respectively V2.

At a pole of the impedance, defined by $L01 \ldots L0n$, Ctot and the coupled proportion of Csec and Lsec, the resonant circuit develops a zero degree phase shift between voltage and current. The switch and the Feedback block develop in their over all transfer function also zero degree. Consequently, the phase condition for a sustained oscillation is fulfilled. The amplitude condition is also fulfilled, because the resulting attenuation Rload is less than the gain in the loop (Qv1, Qv2, resonant circuit and feedback).

The block feedback taps off a part current from the resonant network and generates a square wave drive signal for V1 respectively V2. This drive signal is further coupled as the signal first to a phase locked loop (Phase Locked Loop PLL). Therein a phase comparator (Phase Comp.) compares first versus a reference frequency (fsoll) and filters the resulting error signal in the loop filter. The filtered error signal controls the capacitance of the resonant circuit Ctot.

The concept of voltage-controlled oscillator (VCO Voltage Controlled Oscillator) is used here and in the following as a general term. Here, no distinction is made whether it is a current- or voltage control because both can be transformed into each other. If the oscillator does not oscillate with fsoll, or detunes the reactance in the oscillator, an error signal is developed at the output of the phase comperator (phase Comp.). The filtered error signal adjusts the capacity Ctot until the oscillator frequency (first) becomes equal to the reference frequency (fref). In this manner, different inductor values in L01 . . . L0n, changes in the load unit, component value changes and varying coupling conditions are compensated. The integrating portion of the PLL controls the residual error always to zero. The PLL lock time is determined by the response time of Ctot and the stability in the PLL. In the current invention Ctot has a response time of half a resonant circuit period. Thus, the PLL is dimensioned that its lock time becomes minimal possible after an unlock condition. This favors PLL-based synchronization principles versus software implementations for such applications because of the small hardware costs and its shortest lock time. This is because the phase comparator inside the PLL generates for each network period at least one error signal which influences the control loop. A PLL lock time (step response to a fsoll change) of less than 100 oscillator frequency cycles with a 2nd order low pass filter (loop filter) are easily achieved, unless a frequency prescaler is used in the oscillator signal feedback. Software-based PLL control loops with the same properties can only be achieved with considerably greater effort, because all PLL calculations shall be done in real time within one oscillator period (calculation of phase error and low pass filtering).

The operating voltage VCC' is controlled by pcont in block VCC control. In this manner the oscillator-respectively the resonant network current/voltage amplitude is controlled to the desired energy level of the emitted induction field. Coilselect controls the switches Q01 . . . Q0n and corresponds to a selection signal of the inductors L01 . . . L0n, which are coupled to the resonant network. Coilselect controls the geometric induction field distribution.

The block Radicontrol generates the necessary signals pcont, coilselect, fsoll and loopselect. The control signal radiationdata includes parameters which are required for generating pcont, coilselect, fsoll and loopselect.

Radiationdata containing a first data group, which is required for the generation of pcont. This first data group defining pcont directly and/or are data defining how pcont varies over time. Radicontrol generates based on a first value of the first data group a control signal (Pcont) for VCC control which generates pulses on VCC' and accordingly enables a burst operation in the oscillator. Further, Radicontrol generates based on another value of the first data group a control signal (Pcont) for VCC control which control the amplitude of VCC' and accordingly, the radiated field energy can be adjusted continuously.

Radiationdata contains a second data group which is required for the generation of coilselect. This second data group defining coilselect directly and/or are data defining how coilselect varies over time.

Radiationdata contains a third data group which is required for the generation of fsoll. This third data group defining fsoll directly and/or are data defining how fsoll varies over time.

Radicontrol generates the signal loopselect based on the signal coilselect and also based on fsoll if an fsoll update exceeds a threshold (for example 10%). Loopselect modifies the PLL loop gain in the loopfilter, e.g., by modifying the charge pump current in the output of the phase comparator. If, e.g., only one inductor L01 is selected by coilselect, loopselect generates a lower charge pump current, consequently the Loopfilter gain is lower. If several inductors L01 . . . L0n are selected, the process is reversed and loopselect increases the charge pump current, then the Loopfilter gain is higher. This results in a constant PLL loop gain and guarantees uniform dynamic PLL properties. In a further embodiment of the present invention loopselect connects an additional capacitance to Ctot. This extends the tuning range of the VCO and/or switches to different frequency bands.

By means of these three data groups, Radicontrol can generate independently the three independent transmission parameters: radiated field energy, the area or the space of the radiated field and the frequency of the radiated field.

Thus, e.g., the radiated field energy can be controlled by Pcont at any spectral position (fsoll) and at an arbitrary spatial position. A simple modification of radiationdata maps another radiation properties. Thus, e.g., in this way different country-specific limiting field emission spectra can be generated easily. For this purpose, the third data group of radiationdata includes data causing fsoll to generate no signal at predefined spectral positions.

In one embodiment, Radicontrol alters the reference frequency (fsoll) continuously (sweep) and in another embodiment stochastically, in order to distribute the induction field in a wider spectral band, implemented by excluding predefined fsoll frequencies, spectral positions where no field levels shall be emitted. Advantageously, this reduces the peak level in the frequency spectrum and the over all transmitted power is higher until a legal standardized maximum is reached. As another advantage, other users using the same frequency range are less disturbed and a given frequency band can be better shared. Further, multiple users can also negotiate their frequency range minimize interference and jammer. The major advantage of frequency control loops using phase-locked loops (PLLs) is the independence of the oscillator signal amplitude. This oscillator (VCO) operates always at its ideal conditions (phase and amplitude condition). Consequently, the radiated field remains constant at frequency hop transients.

Figure 4:
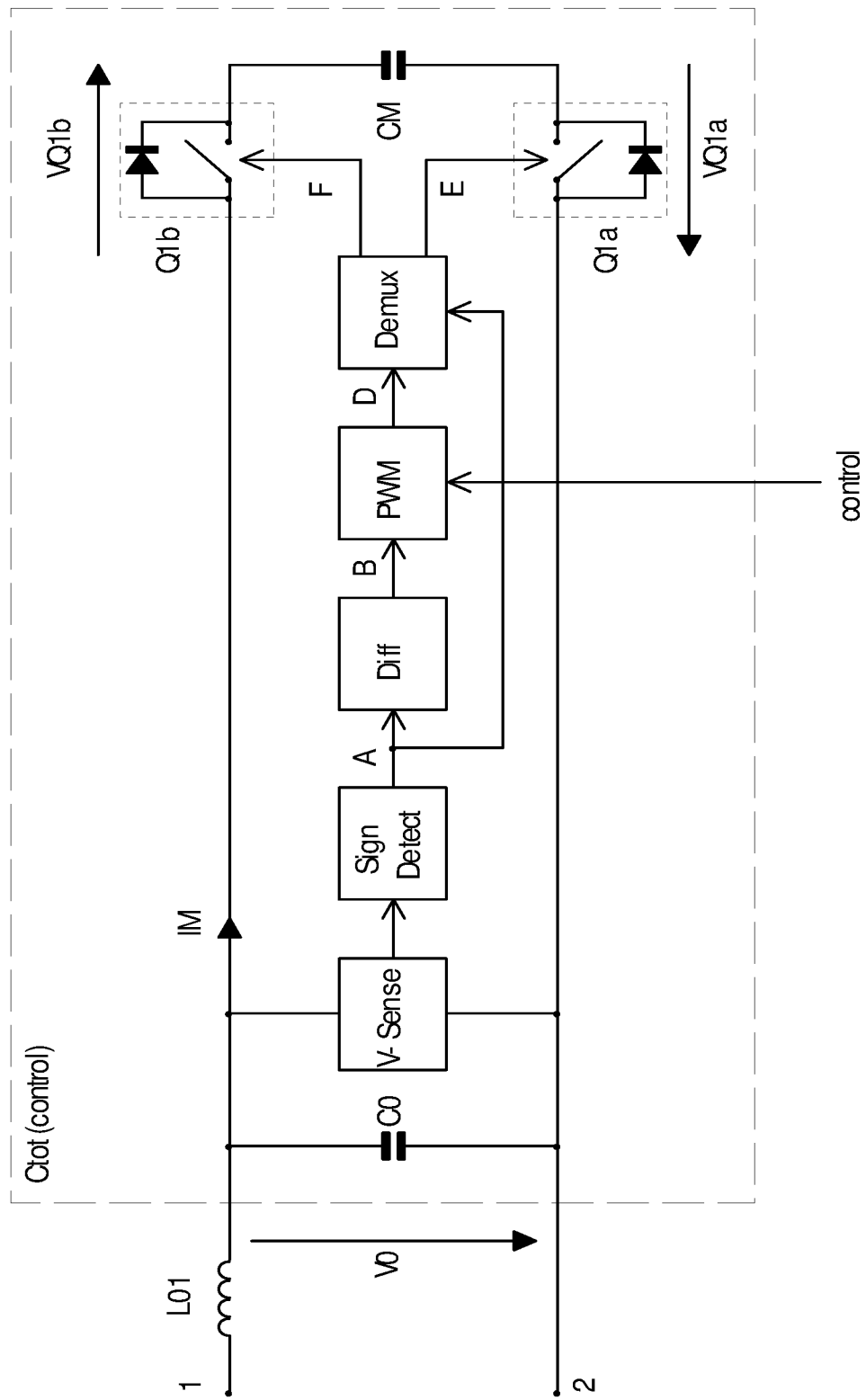
FIG. 4 shows a block diagram of a controlled large signal capacitor according to the FIG. 3.
Figure 5:
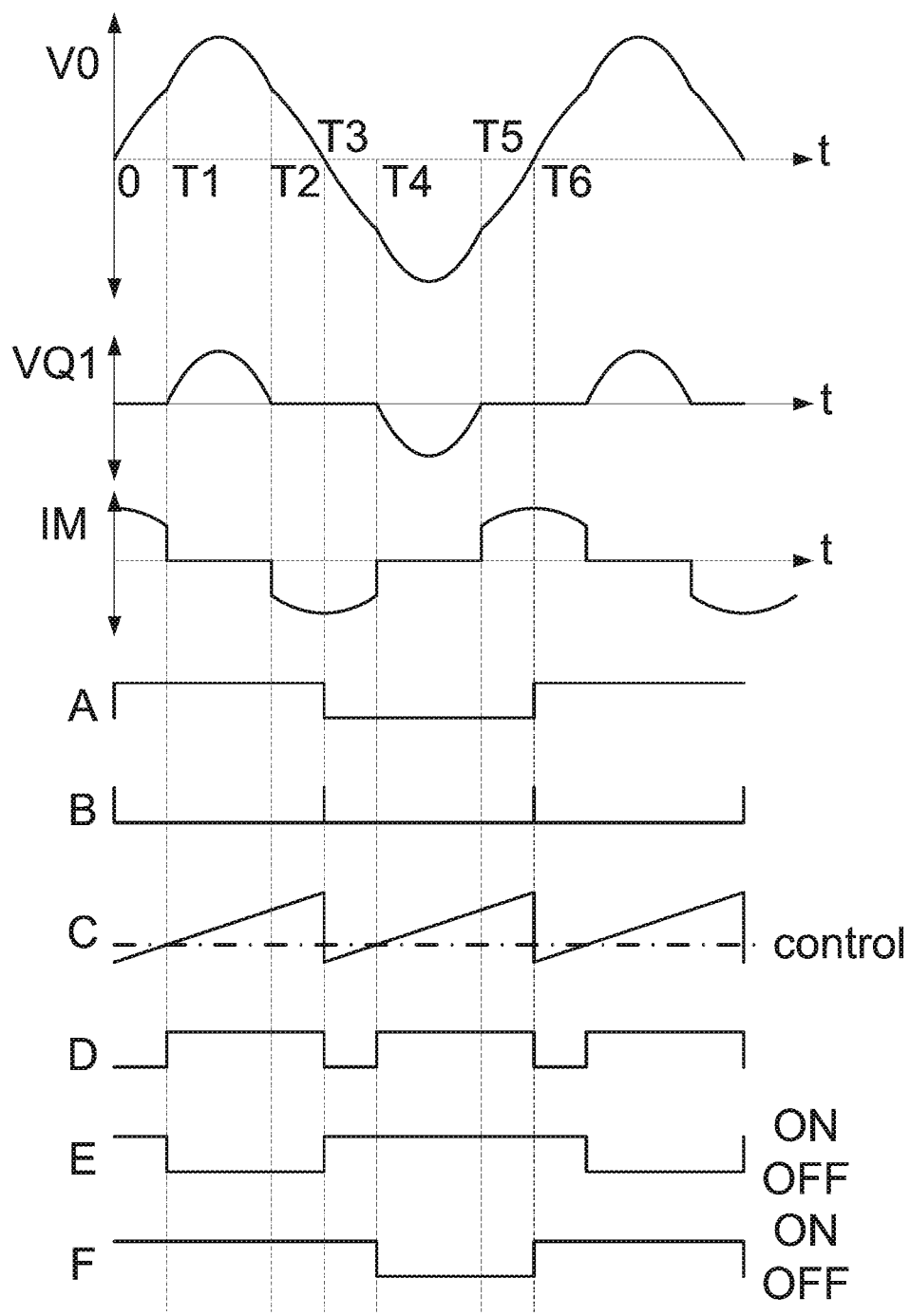
FIG. 5 shows waveforms according to FIG. 4.

FIG. 4 shows a block diagram of a controlled large signal capacitor (Ctot(control)) according to FIG. 3. Signal waveforms of FIG. 4 are shown in FIG. 5 and are used in the further description with its indices. The oscillator is connected at the ports 1 and 2. The inductor L01 (shown as one of a plurality inductors L01 . . . L0n) and the capacitor C0 form a series resonant circuit. The capacitor CM is coupled to C0 via coupling switches Q1a and Q1b. The plotted diodes indicate that the coupling switches are controlled in only one direction. In the opposite current direction Q1a and Q1b remain bridged by the diodes. In the further description, the term switch defines the functional active controllable part of Q1a and Q1b. The term coupling switch defines the functional active controllable part and the diode. The first limiting conditions of the switch control is the one when the coupling switches Q1a and Q1b are always open. Then, the resulting total capacity is equal to C0 and therefore minimal. Consequently, the resonance frequency is maximal. The second limiting conditions of the switch control is the one when the coupling switches Q1a and Q1b are always closed. Then the resulting total capacity is equal to the parallel circuit of C0 and CM and therefore maximal. Consequently, the resonance frequency is minimal. For part interval coupling of CM with C0 any desired intermediate value between the two extreme values can be set for total capacity by the control input Control. Part interval coupling of C0 and CM means a coupling interval defined by a portion of the resulting resonant circuit period. This represents a time- or angle interval in the following description. The whole circuit represents a total capacity (Ctot), whose value is controlled by Control. The resonant circuit frequency equals the average of the entire resonant circuit period. The actual resonant circuit frequency changes within the resonant circuit period between minimum and maximum respectively maximum and minimum based on the states of the two coupling switches. The resulting capacitor voltage V0 is sensed in block V-Sense and coupled to block Sign Detect for sign determination. The capacitor voltage sensing can comprise a voltage tapping, thereby it is only important that the sign of the output signal has a defined phase relationship to the voltage V0 across the capacitor C0. The resulting waveform is shown in A. The following differentiator (Diff) derives A after the time and outputs its absolute value, as shown in trace B. This results in positive pulses at each zero crossing instants 0, T3 and T6 of the resonant circuit voltage V0. The pulse width modulator (PWM) generates a sawtooth C (not shown in FIG. 4, since it is a signal inside the PWM modulator), which runs synchronously with the pulses B. This sawtooth trace C is compared versus the control value Control inside the PWM block. Is Control lower than C, the PWM output D is high. Is Control greater than C, the PWM output D is low. Based on the known pulse width modulation (PWM) principle the PWM-modulator can be realized in various ways. It is only essential that the PWM signal D is triggered by B and the pulse width is controlled by the input Control. The subsequent Demux block uses signal A to selects a portion according to the corresponding half-wave and couples it to the switches Q1a and Q1b. Is A high, the negated signal D controls the switch Q1a via E. Is A low, the negated signal D controls the switch Q1b via F. Is D not linked by A with the output E respectively F, the corresponding output E respectively F remains high. The switch Q1a respectively Q1b is closed (ON) if E respectively F is high. If E respectively F is low, Q1a respectively Q1b is open.

This keeps the switches always at least a half cycle closed and let them bypass their internal diodes. This results in lower conduction losses and prevents the formation of turn-on transients in the diodes, whereby may still flow a current in the diodes. This process reduces in any case losses, especially if the resistance of the switches (Rdson) is sufficiently small. When E becomes low, the coupling switch Q1a opens and it develops a positive half sinusoidal voltage wave in the sum of VQ1=VQ1a+VQ1b during the time interval from T1 to T2. During this interval, no current flows through CM. When the voltage VQ1 becomes zero (time instant T2), the stored energy in L0 generates a negative current flow through the internal diode of the coupling switch Q1a. This lasts from T2 to T3 and is replaced by the above described process of conducting (or inverse conducting) switch Q1a. The coupling switches Q1a and Q1b remain closed until the signal F goes low. It develops a negative half sinusoidal voltage wave in the sum of VQ1 during the time interval from T4 to T5. During this interval, no current flows through CM. When the voltage VQ1 becomes zero (time instant T5), the stored energy in L0 generates a negative current flow through the internal diode of the coupling switch Q1b. This lasts from T5 to T6, and is replaced by the above described process of conducting (or inverse conducting) switch Q1b. The entire current flow interval of the internal diodes is reduced to the interval from T2 to T3 and T5 to T6. In FIG. 4 the capacitors C0 and CM might be connected in series if larger inductor values and/or a higher operational voltage VCC' are demanded (not shown). In this case, the block V-Sense senses the total voltage across both capacitors (C0 and CM). All other blocks and their operation may remain unchanged. This is also the case if in the series circuit of C0 and CM additional capacitors are coupled in parallel to the switches Q1a and Q1b. It is further apparent that the function of the block diagram in FIG. 4 does not change when CM is divided into two partial capacitors and each of the switches Q1a and Q1b couples one of these part capacitors to C0. Advantageously, then, the two switches Q1a and Q1b are in parallel to each other, resulting in smaller conduction losses.

Figure 6:
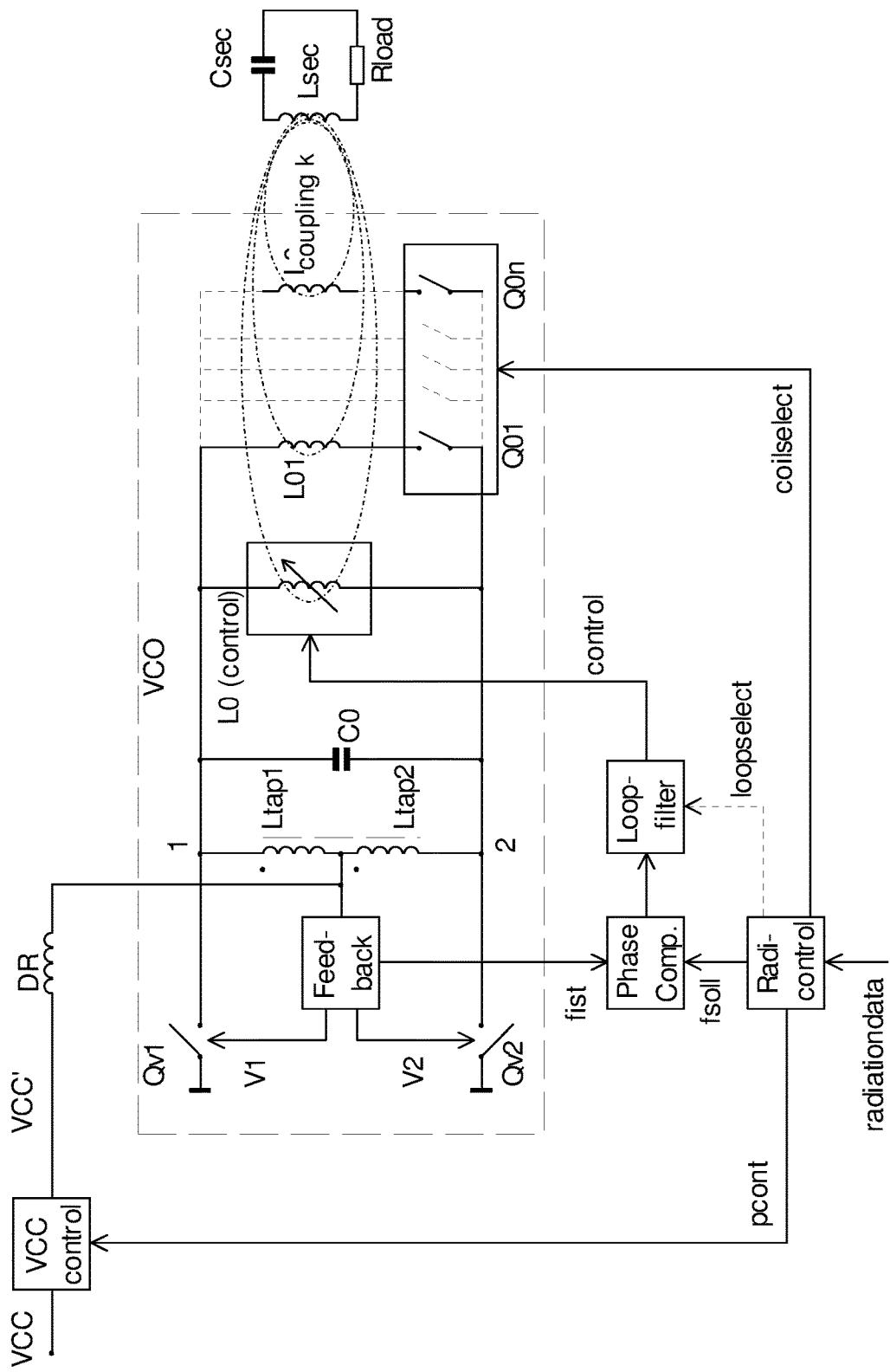
FIG. 6 shows a block diagram of a large signal VCO according to a second exemplary embodiment of the invention.

An oscillator also remains functional when instead of a controlled capacitor, a controlled inductor is used to control the frequency. According to a further embodiment a parallel push-pull oscillator is shown in FIG. 6, which delivers compared to the half-bridge with the same circuitry consumes more output power. A symmetrically tapped coil (Ltap1 and Ltap2) is connected at both ends via a switch (Qv1 and Qv2) alternately to a reference potential (ground). Across the two ends of Ltap1 and Ltap2 one or more controlled inductors (L0) and one or more additional inductors L01 . . . L0n are coupled to Ltap1 and Ltap2. This is alternatively implemented via additional series capacitors (not shown). The capacitor C0 forms with Ltap1, tap2, L0 and L01 . . . L0n a parallel resonant circuit. If more inductors L01 . . . L0n are used, any number of them can be coupled by switches Q01 . . . Q0n to the resonant circuit. In any branches of Q0n, L0n additional series inductors and their switches can be implemented (not shown). These switches bypass these series inductors, depending on their state. Such extended inductor configurations can be required at high VCC', higher transmitted power and/or multiple load units.

A load unit comprises a load resistor (Rload), a pickup inductor (Lsec) and often, but not necessarily a capacitor Csec, that tunes the load unit's resonance frequency to match with the base station radiation field. Alternatively, a parallel resonant circuit can also be used in the load unit (not shown). The proper tuning to either series- or parallel resonance in the load unit is not critical, because the attenuation of Rload increases the bandwidth significantly.

All or any number of inductors Ltap1, Ltap2, L0, L01 . . . L0n are implemented as open coils to couple one or more load units to the resonant circuit of the base station. If several inductors Ltap1, Ltap2, L0, L01 . . . L0n are used, they are positioned on a surface or on multiple surfaces which are at an angle to each other. Is the corresponding coil coupling switch Q01 . . . Q0n closed, the current in the corresponding inductance L01 . . . L0n generates an induction vector. In this manner, the induction field can be distributed arbitrarily on an area or a confined space. Advantageously, the radiated induction field is concentrated to locations where the load units are placed. Thus, only those inductors L01 . . . L0n are coupled to the resonant network, which transfer power to the load units. If only one load unit is present, its coupling with the base station can be improved by coupling more inductors L01 . . . L0n to the resonant network.

The arrangement can be considered as a open transformator in the near field, thereby coupling factor (coupling k) varies with the geometric positioning and with the distance from Ltap1, Ltap2, L0, L01 . . . L0n to Lsec. The feedback includes a feedbackloop to couple the resonant network to the input of the switches Qv1 and Qv2. The coil DR act as a filter in the supply line and reduces the harmonic distortions of the push-pull stage (Qv1, Qv2). Substantially, DR acts as a current source to the tapping point, where a full wave rectified voltage waveform is developed, whose mean is equal to VCC'. The minimum value of the voltage at the tapping point corresponds to the zero voltage crossing of the voltage across C0. This zero voltage crossing representing the temporal minimum value of the tapping voltage of the coils Ltap1, Ltap2 triggers a frequency divider within the block Feedback. The inverted respectively the noninverted output of the frequency divider controls Qv1 or Qv2. Is for example Qv1 closed and Qv2 open, a sinusoidal voltage half wave is generated at the entrance of the Feedback block, whose amplitude is half the amplitude of the voltage across C0. When this voltage reaches its minimum, the frequency divider is triggered and the drive signals of Qv1 and Qv2 change their states. Qv2 is closed and Qv1 is open. Again, a sinusoidal voltage half-wave is generated, whose amplitude is half the amplitude of the voltage across C0. When this voltage reaches again its minimum, the frequency divider is triggered and the drive signals of Qv1 and Qv2 change again their states.

One or both drive signals from Qv1 respectively Qv2 or the trigger signal of the frequency divider within the block Feedback is compared as first versus a reference frequency (fsoll) within the phase comparator (Phase Comp.). The error signal from the block Phase Comp. is filtered in the block Loopfilter. The filtered error signal controls the inductor L0 of the resonant network.

If the oscillator does not oscillate with fsoll, or changes the admittance in the oscillator, an error signal is obtained at the output of the phase (Phase Comp.). The filtered error signal controls the inductor L0 until the oscillator frequency (first) becomes equal to the reference frequency (fsoll). In this manner, different inductor values in L01 . . . L0n, changes in the load unit, component value changes and altering coupling conditions are balanced and compensated. The integrating portion of the PLL controls the residual error always to zero. The PLL lock time is determined by the response time of L0 and the stability in the PLL. In the current invention L0 has a response time of half a resonant circuit period. Thus, the PLL is dimensioned that its lock time becomes minimal possible after an unlock condition.

The blocks VCC control, Radicontrol and also their input and outputs signals behave identically to their eponymous in FIG. 3. This means the same modes are implemented.

Figure 7:
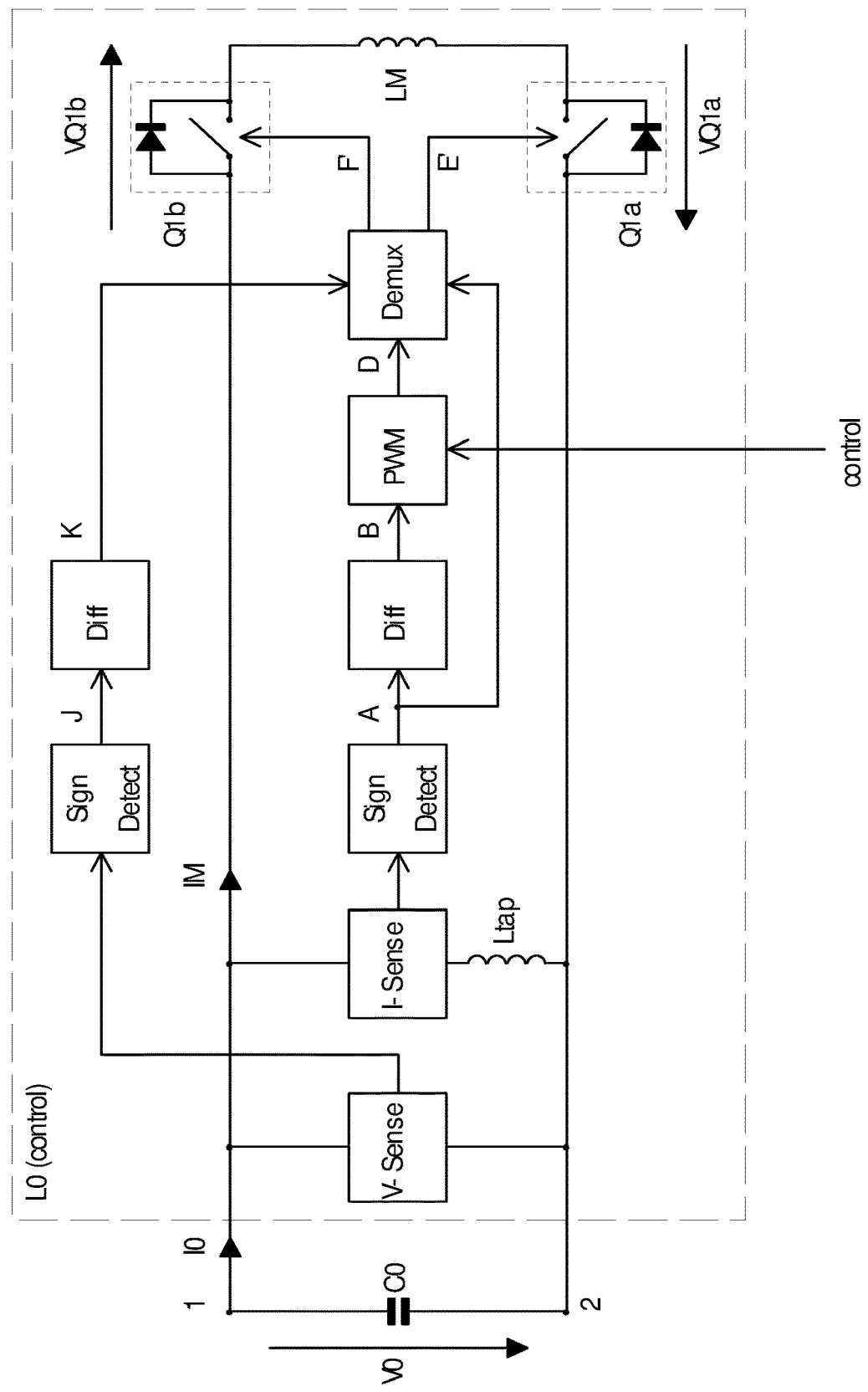
FIG. 7 shows a block diagram of a controlled large signal inductor according to the FIG. 6.
Figure 8:
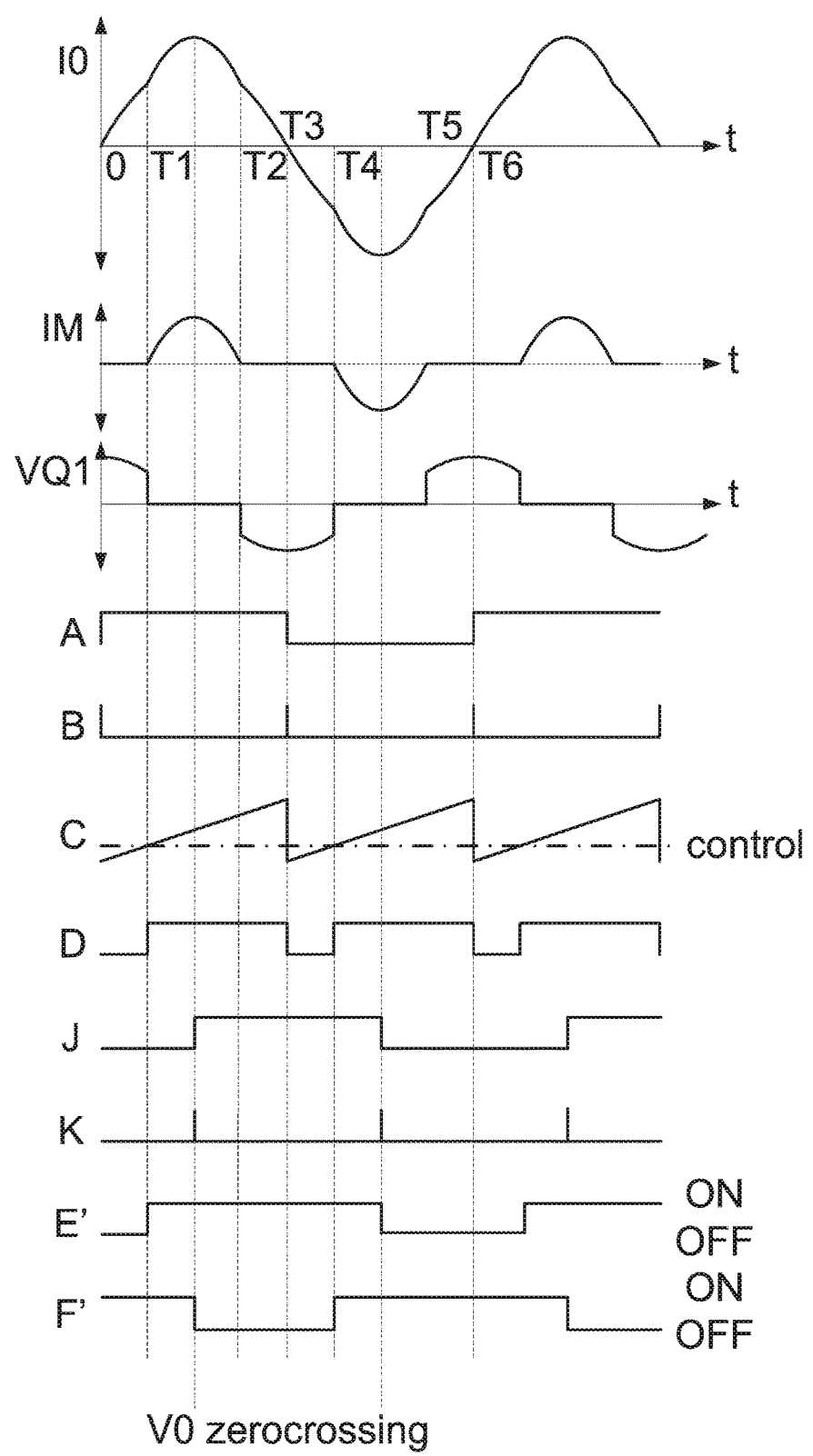
FIG. 8 shows waveforms according to FIG. 7.

FIG. 7 shows a block diagram of a controlled large signal inductor (L0(control)) according to FIG. 6. Signal waveforms of FIG. 7 are shown in FIG. 8 and are used in the further description of its indices. The oscillator is connected at the ports 1 and 2. As a simplification only one inductor Ltap (resulting inductor from Ltab1 and Ltab2) is shown in FIG. 7. Ltap form together with C0 a parallel resonant circuit. The inductor LM is coupled to Ltap via coupling switches Q1a and Q1b. The first limiting conditions of the switch control is given when the coupling switches Q1a and Q1b are always open. Then, the resulting total inductivity is equal to Ltap and therefore maximal. Consequently, the resonance frequency is minimal. The second limiting conditions of the switch control is the one when the coupling switches Q1a and Q1b are always closed. Then the resulting total inductivity is equal to the parallel circuit of Ltap and LM and therefore minimal. Consequently, the resonance frequency is maximal. For part interval coupling of LM with Ltap, any desired intermediate value between the two extreme values can be set for the total inductivity by the control input Control. The resonant circuit frequency is obtained as the average of the entire resonant circuit period.

The actual resonant circuit frequency changes within the resonant circuit period between minimum and maximum respectively maximum and minimum based on the states of the two coupling switches. The resulting inductor current is sensed in block I-Sense and coupled to block Sign Detect for sign determination. The inductor current sensing can comprise a current tapping. It is only important that the sign of the output signal has a defined phase relationship to the current I0 of the inductor L0. The resulting waveform is shown in A. The following differentiator (Diff) derives A after the time and outputs its absolute value, see trace B. This results in positive pulses for each zero crossing instants 0, T3 and T6 of the resonant circuit current I0. The pulse width modulator (PWM) generates a sawtooth C (not shown in FIG. 6, since it is a signal inside the PWM modulator), which is synchronous with the pulses B. This sawtooth trace C is compared versus the control value Control inside the PWM block. Is Control lower than C, the PWM output D is high. Is Control greater than C, the PWM output D is low.

Based on the known pulse width modulation (PWM) principle the PWM-modulator can be realized in various ways. It is only essential that the PWM signal D is triggered by B and the pulse width is controlled by the input Control. The voltage across the Ltap is sensed in block V-Sense and the following block Sign Detect determines its sign, see signal J. The following differentiator (Diff) derives J after the time and outputs its absolute value, see curve K. This results in positive pulses for each zero crossing of the resonant circuit voltage V0 (see V0 zero crossing in FIG. 7). The timing of the signal pulses K coincide with the maxima and minima of the current I0. The signal C is associated with A and D in Demux to generate the drive signals E' and F' for the switches Q1a and Q1b. The switch Q1a respectively Q1b is closed (ON), if E' respectively F' is high. If E' respectively F' is low, then Q1a respectively Q1b is open. Is A high, the signal D controls via E' the closing of switch Q1a (see time instant T1). Is A low, the signal D controls via F' the closing of switch Q1b see (time instant T4). The transition from high (ON) to low (OFF) in E' and F' is controlled by signal K in conjunction with signal A, see time points V0 zero crossing in E' and F'. Signal A selects the switch being controlled. Is A low, the switch Q1a opens via E' with K. Is A high, the switch Q1b opens via F' with K. The ON to OFF transition control of the switches by using K, halves the diode current flow interval comparing to control signals that are generated only by A and D (not shown in FIG. 7). The reduced diode current flow interval results in smaller losses and prevents the formation of turn on transients in the diodes. There may still flow a current in the diodes. This process reduces in any case losses, especially if the resistance of the switches (Rdson) is sufficiently small. When E' becomes high, the coupling switch Q1a closes and it develops a half sinusoidal current wave in IM. During this interval, the total coupling switch voltage VQ1=VQ1a+VQ1b is zero, because both coupling switches are closed. If the current IM becomes zero at time instant T2, the stored energy in C0 generates a negative voltage step in the internal diode of Q1b and consequently the current flow interrupts. When F' becomes high, the coupling switch Q1b closes and it develops a negative half sinusoidal current wave in IM during the time interval from T4 to T5. During this interval, the total coupling switch voltage VQ1 is zero, because both coupling switches are closed. If the current IM becomes zero at time instant T5, the stored energy in C0 generates a negative voltage step in the internal diode of Q1b and consequently the current flow interrupts. The current flow interval of the internal diode is limited to the interval from V0 zero crossing to T2 of the positive half wave of IM respectively T5 in the negative half wave of IM.

In a further embodiment of FIG. 6, L0(control) is divided into two or more parallel-controlled inductors. In that case each branch includes a partial inductor of L0(control) and either one or two of switches (Q1a and/or Q1b). Is per partial inductor L0(control) only one switch implemented, then, in the second partial inductor is also only one switch implemented and they are driven that the combined current per inductors pair results in a waveform corresponding to the waveform IM in FIG. 8. Thus, this advantageously maintains the symmetry and keeps the harmonic components in the oscillator and in the radiated induction field minimal.

Figure 9:
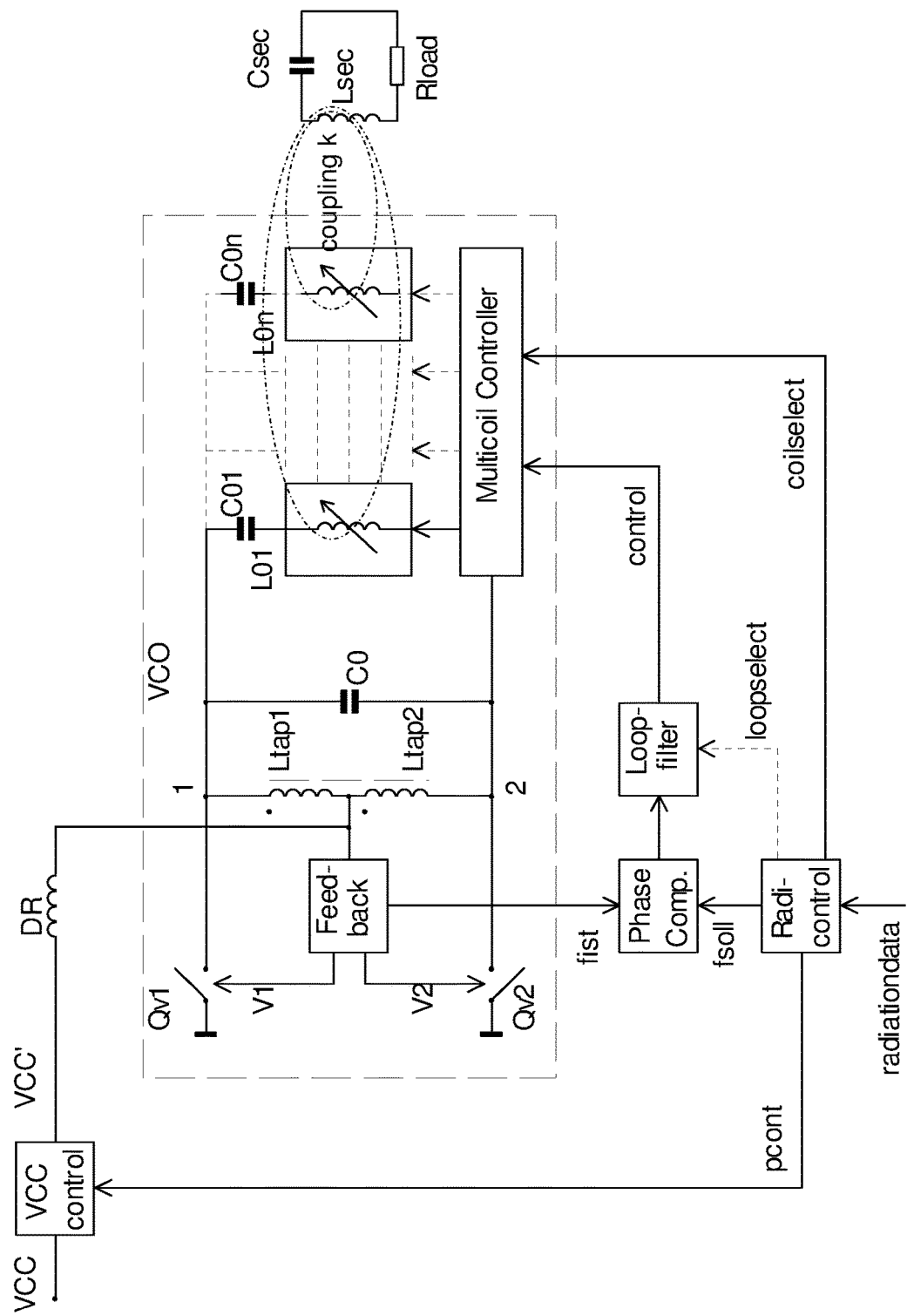
FIG. 9 shows a block diagram of a large signal VCO according to a third exemplary embodiment of the invention.

An oscillator also remains functional when a controlled resonant network is used to control the frequency of a resonant circuit. According to a further embodiment, FIG. 9 shows a parallel push-pull oscillator based on the one in FIG. 6. The frequency control includes not only a controlled inductance but at least one or more series circuits C01, L01 . . . C0n, L0n, which are coupled via switches to the parallel resonant circuit (Ltap1, Ltap2 and C0). The switches are integrated here in block Multicoil Controller and they are used for frequency and induction field control. The corresponding input signals are the output of the Loopfilter (control) and coilselect from the block Radicontrol. The filtered error signal (control) controls one or more series circuits C01, L01 . . . C0n, L0n of the resonant network.

If the oscillator does not oscillate with fsoll, or changes the admittance in the oscillator, an error signal is obtained at the output of the phase (Phase Comp.). The filtered error signal controls one or more series circuits C01, L01 . . . C0n, L0n until the oscillator frequency (first) becomes equal to the reference frequency (fsoll). In this manner different inductor values in L01 . . . L0n, changes in the load unit, component value changes and altering coupling conditions are balanced and compensated. The integrating portion of the PLL controls the residual error always to zero. The PLL lock time is determined by the response time of the series circuit C01, L01 . . . C0n, L0n and the stability in the PLL. In the current invention the series circuit C01, L01 . . . C0n, L0n has a response time of half a resonant circuit period. Thus, the PLL is dimensioned that its lock time becomes minimal possible after an unlock condition.

The blocks VCC control, Radicontrol and also their input and outputs signals behave identically to their eponymous in FIG. 3. This means the same modes are implemented.

All inductors (L01 . . . L0N) in the oscillator and alternatively also Ltap1, Ltap2 can contribute to the power transmission from the base station to the load units. The oscillator is functionally identical with FIG. 6. The description of FIG. 6 addresses implementation variants concerning additional inductor coupling to the parallel resonant circuit (Ltap1, Ltap2 and C0) and they apply without restrictions also to the FIG. 9. Functionally, the frequency control by means of series circuits C01, L01 . . . C0n, L0n behaves substantially identical to the inductor control of FIG. 6.

Figure 10:
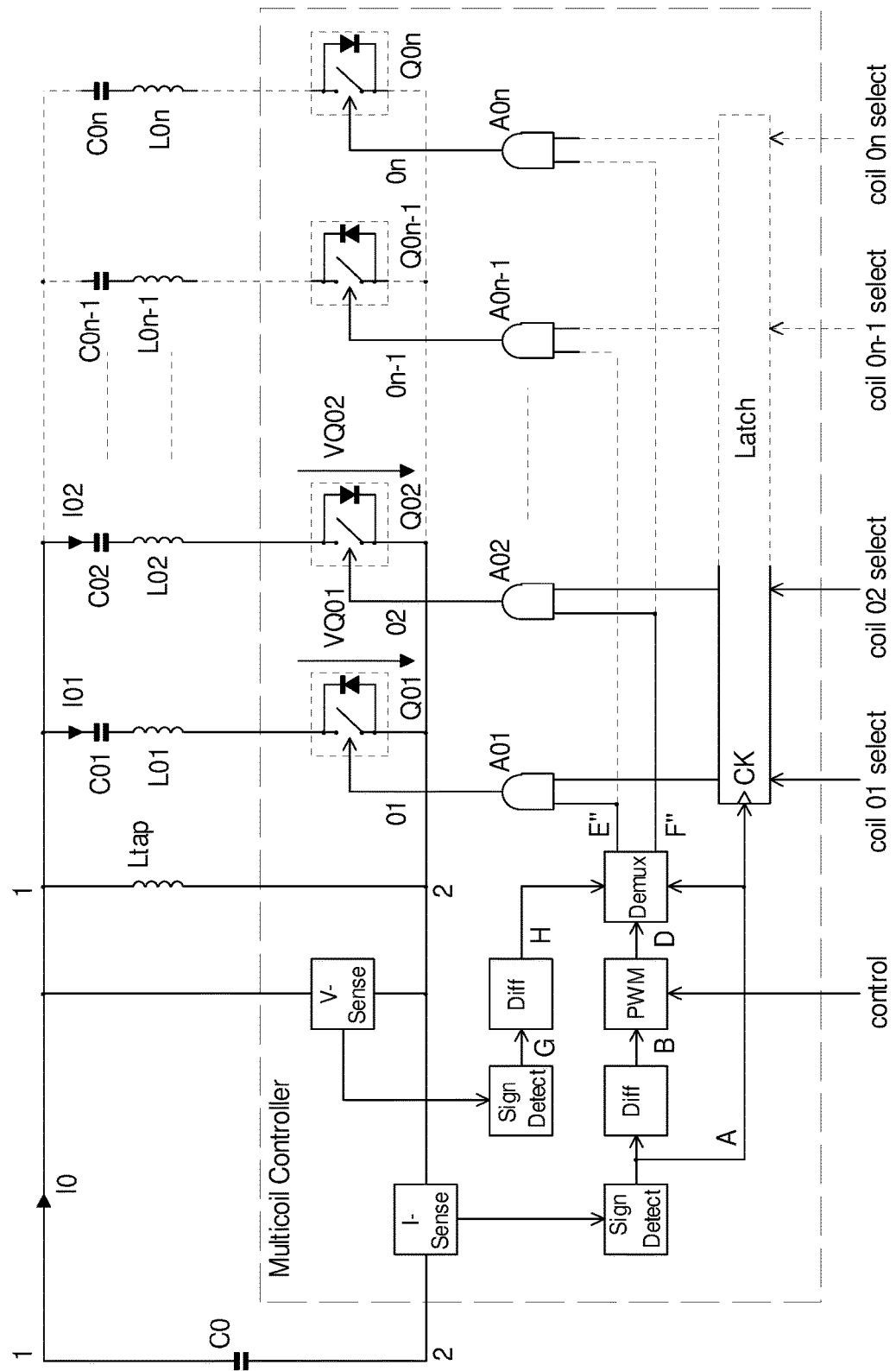
FIG. 10 shows a detailed block diagram according to FIG. 9.
Figure 11:
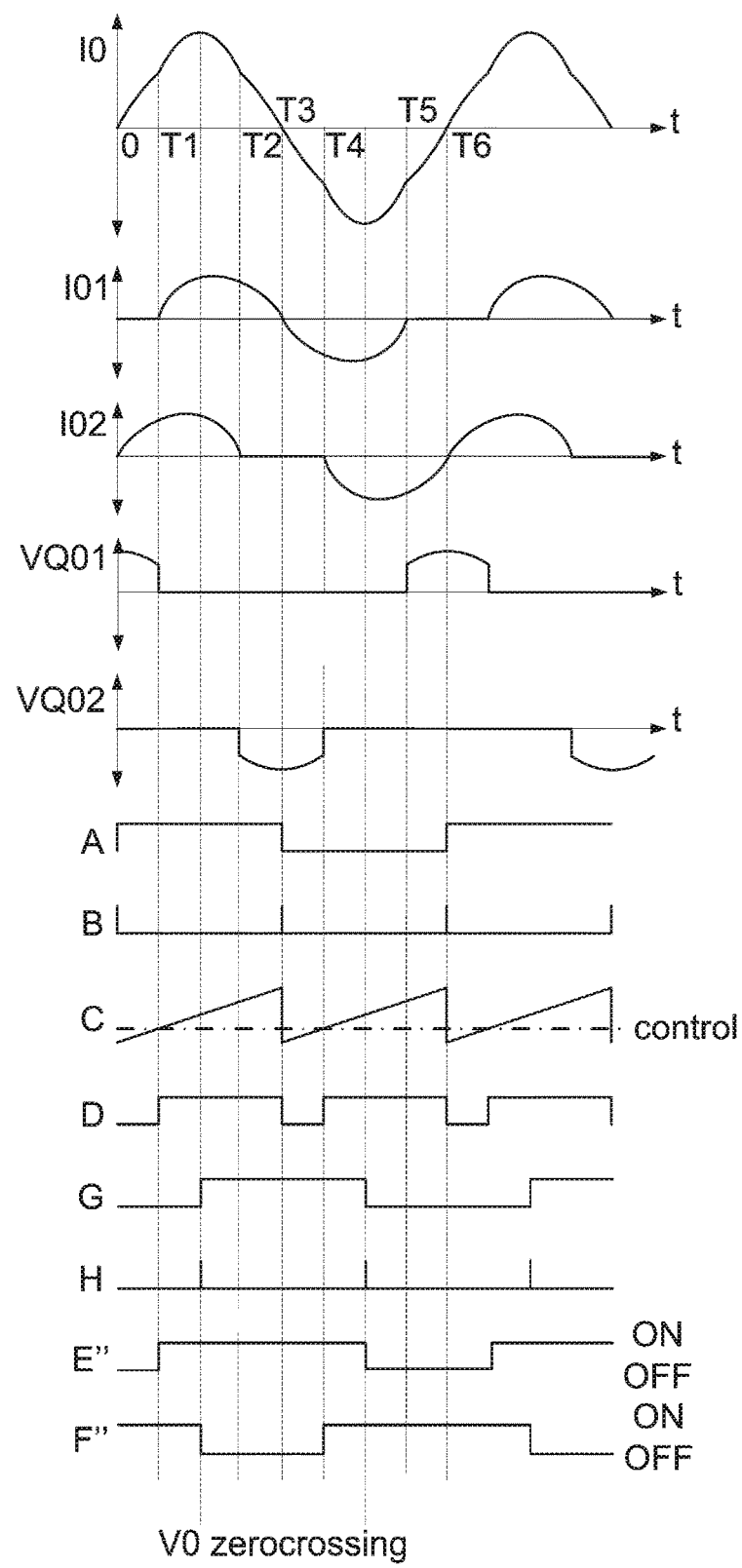
FIG. 11 shows waveforms according to FIG. 10.

The coupling switch control of the resonant network according to FIG. 9 is shown in FIG. 10. The corresponding signals are shown in FIG. 11 and are used in the further description with their indices. The oscillator coupling ports are 1 and 2. As a simplification, the resulting total inductance Ltap (from Ltap1 and Ltap2) is shown in FIG. 10. It forms together with the capacitance C0 a parallel resonant circuit. One or more series circuits C01, L01 . . . C0n, L0n are coupled via one or more coupling switches Q01 . . . Q0n with to Ltap. The first limiting condition of the switch control is the one when all coupling switches Q01 . . . Q01n are always open. Then, the resulting total inductivity is equal to Ltap and therefore maximal. Consequently, the resonance frequency is minimal. The second limiting condition of the switch control is the one when the coupling switches Q01 . . . Q01n are always closed. Then the resulting total inductivity is equal to the parallel circuit of Ltap and the resulting inductivity of all series circuit C01, L01 . . . C0n, L0n and therefore minimal. Consequently, the resonance frequency is maximal. The series circuits C01, L01 . . . C0n, L0n are dimensioned such that the series resonance frequency for permanently closed switches Q01 . . . Q01n is lower than the lowest network frequency respectively lowest oscillator frequency. In this case, the series circuits act as inductors and thus can control the total inductance of the entire network. For part interval coupling of C01, L01 . . . C0n, L0n with Ltap, any desired intermediate value between the two extreme values can be set for the total inductivity by the control input control. The resonant circuit frequency is obtained as the average of the entire resonant circuit period. The actual resonant circuit frequency changes within the resonant circuit period according to the states of the two coupling switches.

The resulting inductor current is sensed in block I-Sense and coupled to block Sign Detect for sign determination. The inductor current sensing can comprise a current tapping of I0. It is only important that the sign of the output signal has a defined phase relationship to the current I0 of the inductor Ltap. The resulting waveform is shown in A. The following differentiator (Diff) derives A after the time and outputs its absolute value, see trace B. This results in positive pulses for each zero crossing instants 0, T3 and T6 of the resonant circuit current I0. The pulse width modulator (PWM) generates a sawtooth C (not shown in FIG. 10, since it is a signal inside the PWM modulator), which is synchronous with the pulses B. This sawtooth trace C is compared versus the control value Control inside the PWM block. Is Control lower than C, the PWM output D is high. Is Control greater than C, the PWM output D is low. Based on the known pulse width modulation (PWM) principle the PWM-modulator can be realized in various ways. It is only essential that the PWM signal D is triggered by B and the pulse width is controlled by the input Control. This pulse length corresponds to a controlled delay which starts at the trigger moment (signal B) and whose length is controlled by control.

The voltage across the Ltap is sensed in block V-Sense and the following block Sign Detect determines its sign, see signal G. The following differentiator (Diff) derives G after the time and outputs its absolute value, see curve H. This results in positive pulses for each zero crossing of the resonant circuit voltage V0 (see V0 zero crossing in FIG. 7). The timing of the signal pulses H coincide with the maxima and minima of the current I0. The signal H is associated with A and D in Demux to generate the drive signals E" and F" for the switches Q01 . . . Q0n. The drive signals E" and F" are coupled via the AND gates A01 . . . A0n to the corresponding coupling switches. E" is identical to 01, 03 . . . 0n-1 and F" is identical to 02, 04 . . . 0n, if coilselect releases all ANDs A01 . . . A0n on E" and F". The corresponding selection signals coil 01 select . . . coil 0n select are coupled by signal A to the corresponding AND inputs. In this way, coil 01 select . . . coil 0n select are allowed to change at arbitrary times. There is always a well defined drive signal 01 . . . 0n locked to the network period. The switches Q01 . . . Q0n are closed (ON), if E" respectively F" is high. If E" respectively F" is low, then, Q01 . . . Q0n are open. Is A high, signal D controls via E" the closing of switch Q01 (see time instant T1). Is A low, signal D controls via F" the closing of switch Q02 (see time instant T4). The transition from high (ON) to low (OFF) in E" and F" is controlled by signal H in conjunction with signal A, see time points V0 zero crossing in E" and F". Signal A selects the switch being controlled. Is A low, switch Q01 opens via E" with H. Is A high, switch Q02 opens via F" with H. The switches are always at least a half-period closed and thus bridge at least partially their internal diodes. The reduced diode current flow interval results in smaller losses and prevents the formation of turn on transients in the diodes. There may still flow a current in the diodes. This process reduces in any case losses, especially if the resistance of the switches (Rdson) is sufficiently small. When E" becomes high, the coupling switch Q01 closes and it develops a current wave in I01. This current wave represents a coupling interval which is twice as long as the interval from T1 to T3. During this whole coupling interval is the coupling switch voltage VQ01 zero. At time instant T3 the total energy of the series circuit C01, L01 is stored in C01. Further, the current I01 passes through its zero point at time T3 and subsequently discharges the capacity C01 by a negative current I01 in the interval from T3 to T5. Becomes the current I01 again zero at the time instant T5, the current flow interrupts until E" the next coupling interval of the series circuit C01, L01 and the rest of the resonant network releases. When F" becomes high, the coupling switch Q02 closes and it develops a current wave in I02. This current wave represents a coupling interval which is twice as long as the interval from T4 to T6. During this whole coupling interval is the coupling switch voltage VQ02 zero. At time instant T6 the total energy of the series circuit C02, L02 is stored in C02. Further, the current I02 passes through its zero point at time T6 and subsequently discharges the capacity C02 by a negative current I02. This coupling half period is identical to the interval from 0 to T2. Becomes the current I02 again zero at the time instant T2, the current flow interrupts until F" the next coupling interval of the series circuit C02, L02 and the rest of the resonant network releases. The resonance frequency of the overall network changes depending on the coupling status of the series circuits and the total network. In the intervals from 0 to T1 and T5 to T6, the total network period is determined by C0, Ltap, C02 and L02. At the intervals of T1 to T2 and T4 to T5, the overall network resonance frequency is determined by C0, Ltap, C01, L01, C02 and L02. In the interval from T2 to T4, the overall network period is determined by C0, Ltap, C01 and L01. This is valid, unless one takes into account the load unit, otherwise a part of the resulting load influences in each sub-interval the network additionally. By subsequent delayed turn on in the coupling switch the coupling decreases the coupling period and the circuit is driven less. Accordingly, the fewer changes the overall network period respectively the overall frequency. Falls the coupling period below the half of the overall network period there is no more overlapping within the two coupling periods of C01, L01 and C02, L02. Advantageously, in this manner, with only one active element (with only one switch), an inductance (L01 . . . L0n) is driven with a symmetrical current wave. This results in less harmonics in the radiated induction field. However, lower harmonics are generated whenever a pair of series circuits (see C01, L01, Q01 and C02, L02, Q02) are coupled together to the overall network in an anti-parallel configuration. The radiation fields in the two inductors L01 and L02 compensates in this case. One can easily recognize that even using one single switch (for example Q01) and one series circuit (for example C01, L01) a zero line symmetric current waveform is generated. This leads for lower circuit implementation costs and to a substantially purer radiated spectrum (smaller or less harmonic distortions) with respect to FIG. 6.

Figure 12:
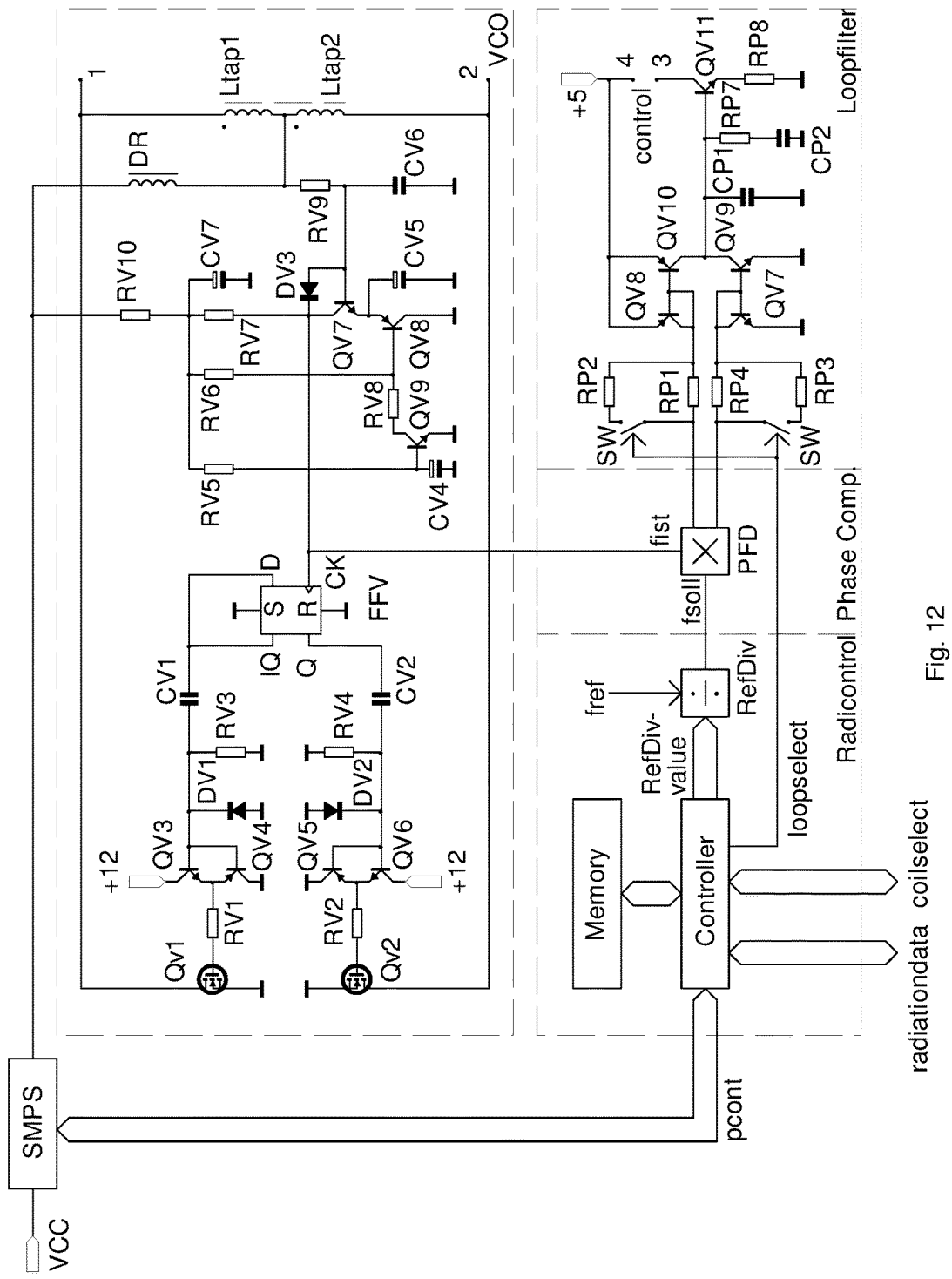
FIG. 12 shows a detailed circuit diagram of an exemplary embodiment of the invention.

FIG. 12 shows a detailed circuit of a parallel push-pull large signal VCO according to the current invention. The oscillator corresponds substantially to that of FIGS. 6 and 9. Ltap1, Ltap2 are in one embodiment the ration coil (or at least part thereof) of the induction vector. At each one terminal of the coupled inductors Ltap1, Ltap2 is a switch Qv1 and Qv2 connected to ground.

The block VCC control, here implemented as a switched mode power supply (SMPS), delivers the operating voltage via DR to the center of Ltap1, Ltap2. The resonant circuit is connected at terminals 1 and 2. This is in the simplest case, a controlled capacitor. In another embodiment, these are controlled capacitors/inductors or controlled series circuits of the two.

RV9 and CV6 form a low pass, which dampens transients. QV7, DV3 and RV7 form the voltage minimum detector whose reference voltage is filtered by CV5 and buffered by QV8. The reference voltage is determined by the voltage divider RV6 and RV8. QV9 is only responsible for the startup in the oscillator, after the startup operation QV9 remains always conducting by RV5. The reference voltage tracks with the mean of the input voltage by RV10 and CV7. This opens QV7 at the minimum of the voltage across CV6 makes the switching operation in QV7 independent of the output voltage from the SMPS. The resulting pulses at the collector QV7 trigger flip-flop FFV and let its outputs Q and IQ toggle.

Consequently, the driver transistors QV3 . . . QV6 are always driven with opposite signals by CV1 and CV2 and let the switches Qv1 and Qv2 also toggle inversely to each other. The components CV1, CV2, RV3 and RV4 ensure that both switch Qv1 and Qv2 remain open in case of a missing clock at the entrance of FFV. Because of this, RV3 and RV4 establish a grounded DC-level on both inputs of the drivers. In normal operation, DV1 and DV2 clamp the rectangular drive waveform to ground. This results in driver voltage levels from approximately 0 . . . 12V.

The startup of the circuit is done by the time constant of RV5, CV4. The reference voltage across CV5 is equal to the voltage across CV7 at an initialized startup and this remains QV7 in its open state. Becomes QV9 conducting, the reference voltage across CV5 drops and QV7 turns on. This generates a first pulse, which toggles FVV and alters the drive signals at Qv1 and Qv2. Once the half sine wave at the center of Ltap1, Ltap2 becomes again minimal, FFV triggers again. The switches Qv1, Qv2 change their states and the oscillator starts. This digital control of the switches Qv1 and Qv2 guarantees the lowest losses, because the switch state change occurs at the lowest voltage across the switches. This corresponds to zero voltage switching (ZVS).

The trigger signal from FFV is coupled as the signal first to the phase comparator (Phase Frequency Detector PFD). The comparison frequency (fsoll) is generated from a controlled frequency divider (RefDiv) whose input clock is a constant reference frequency (fref), for example 32 MHz. The PFD is equivalent to the known circuit of the CMOS device CD4046. In contrast to CD4046, here, the PFD-output signals are coupled independently via the resistors RP1 . . . RP4 and a current mirror QV8, QV10 respectively QV7, QV9 to the loop filter CP1, CP2 and RP7. Transconductance amplifier QV11 generates proportional to the control voltage developed across the loop filter a control current for the controlled admittances. The PLL-loop gain is altered through the analog switch SW by means of RP2 and RP3.

This changes the charge pump current in QV9 and QV10, which flows into the loop filter.

Figure 13:
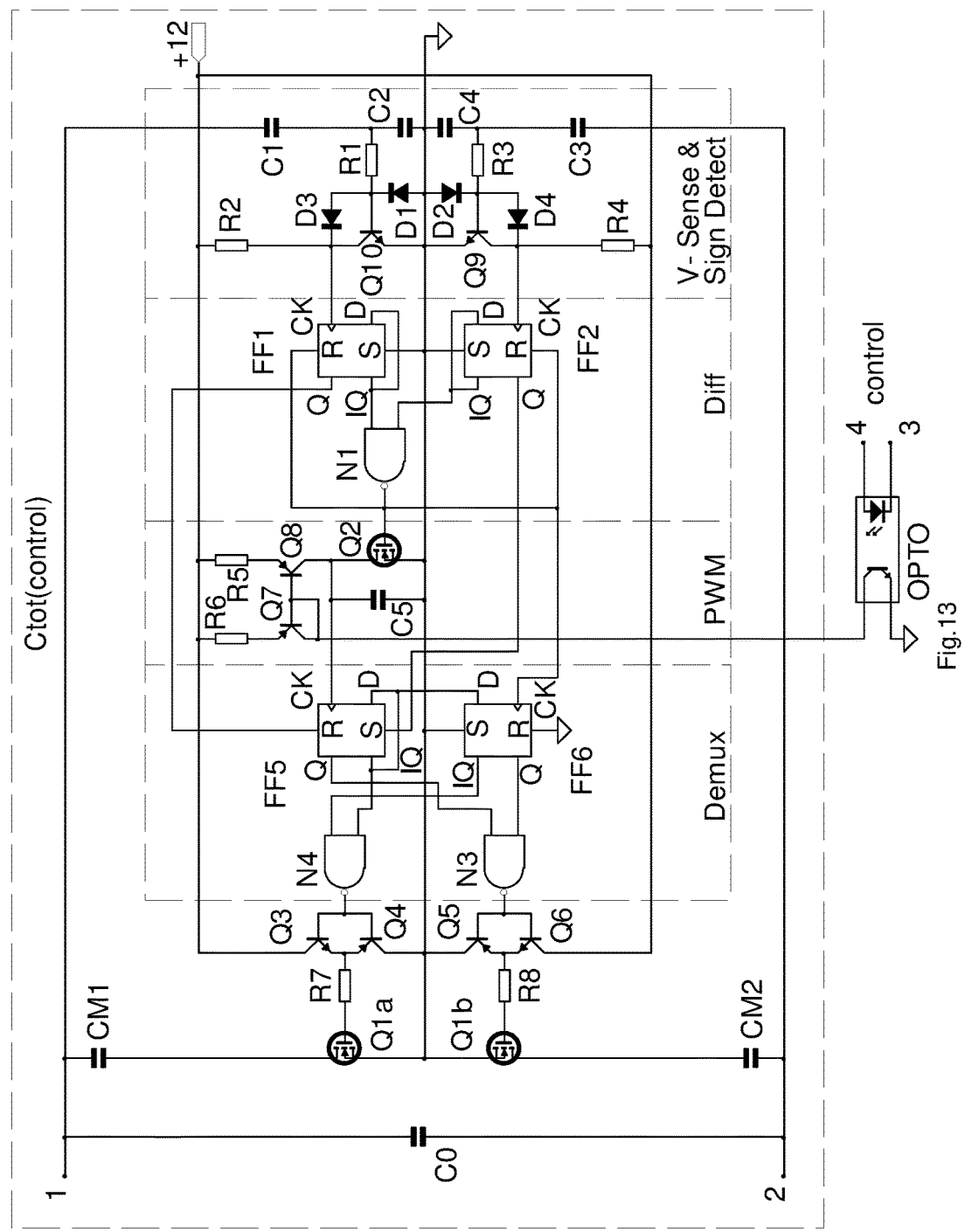
FIG. 13 shows a detailed circuit diagram of an exemplary embodiment of the invention.

FIG. 13 shows a detailed circuit of a controlled capacitor according to FIG. 4. The dashed lines include parts of the block diagram. The oscillator coupling terminals are 1 and 2. In the further description waveforms of FIG. 5 are referenced with their indices. CM is designed as a series connection of two capacitors CM1 and CM2, which is coupled to Q1a and Q1b to C0. The switch control circuit operates at a supply voltage +12'. An opto coupler transmits the control information (Control) isolated, because the switch control circuit operating on +12', shall be electrically isolated from the rest of the network. The capacitors C1 and C2 sense the positive voltage half-wave of V0 and couple it via R1 to the base of transistor Q10. Q10 acts as a quasi-zero-voltage detector of the positive half wave. D1 and D3 accelerate the turn off in Q10 as soon as the voltage across C2 falls below the threshold voltage of Q10. The capacitive voltage divider C1, C2 prevents DC coupling with V0. In addition, the components R1, C1 and C2 may provide a phase advance. To this end, these components are so dimensioned that the phase advance value is at least as large as the entire signal delay of the control circuit. This allows the use of the entire control range of the circuit. The components of Q9, D2, D4, R3, R4, C3 and C4 operate identically to the components of Q10, being responsible for the negative half wave of V0. The two D flip-flop FF1, FF2 and the NAND gate N1 detect the two positive edges of the output signals of the zero-voltage detectors Q9 and Q10. This sets alternately the output Q of a flip-flop (FF1 respectively FF2) to high, once it is triggered on the clock CK. This state is immediately reverted by the corresponding reset input after the propagation time of N1. This results in voltage pulses at the output of N1 at each zero crossing of V0 (waveform B) consequently, this closes Q2 completely during the representative short time interval. This symmetrical implementation guarantees identical behavior with respect to the two voltage half-waves of V0. In addition, Q2 is coupled with the voltage V0 only during the brief moment of the trigger event. Q7, Q8, R6 and R5 mirror a control current, defined by the control variable control, which flows into the capacitor C5. The result is a sawtooth voltage on C5 (curve C), whose timing of its lowest level fall together with the control pulses of Q2. This sawtooth triggers FF5 via the input CK as soon as its switching threshold is reached. This time can be controlled via the control input control, because the slope of the sawtooth voltage changes by the collector current in Q8 and thus varies with control. FF5, FF6, N3 and N4 form the first part of the Demux. FF5 is configured with pulses on the Set (S) respectively Reset (R) inputs that the sawtooth always becomes responsible for the corresponding switch, which is responsible for the corresponding half-wave. That represents a switching signal selection by signal A. Appears V0 with the its positive half wave, D2 is conducting. The collector of Q9 is high and triggers FF2 on CK. The short appearing high pulse on output Q of FF2 set the output Q of FF5 via its set (S) input. The low at output IQ of FF5 forces a high on the output of N4, which closes Q1a by the drivers Q3, Q4. This is the initial condition for the controlled decoupling of CM1 and CM2 during the positive half wave of V0. If the switching threshold of the PWM modulator is reached (the voltage across C5 is equal to the threshold of FF5), FF5 toggles: Q is low and IQ is high. IQ of FF6 is also high, thus the output of N4 switches to low, consequently the coupling switch Q1a is opened by the drivers Q3, Q4. A similar situation happens during the negative half wave of V0. FF5 is reset via the R input by FF1 when D1 is conducting and FF1 triggers on the clock CK. This forces a high at the output of N3, which closes Q1b by the drivers Q5, Q6. This is the initial condition for the controlled decoupling of CM1 and CM2 during the negative half wave of V0. If the switching threshold of the PWM modulator is reached (the voltage across C5 is equal to the threshold of FF5), FF5 toggles: Q is high and IQ is low. Q of FF6 is also high, thus the output of N3 switches to low, consequently the coupling switch Q1b is opened by the drivers Q5, Q6. The closing of the switches is established by output of N1, which triggers FF6. Consequently the outputs of FF6 become equal to those of FF5. This forces N3 respectively N4, which was previously at a low output low level to a high output level. This ensures that from this point in time both switches Q1a and Q1b remain closed until the PWM modulator opens again one of the two switches.

After the circuit start-up, the flip-flop FF6 resynchronizes itself after a maximum time interval during one resonant circuit period. Then, always at least one of the coupling switches Q1a respectively Q1b has been opened and a clock pulse is generated for FF6.

Figure 14:
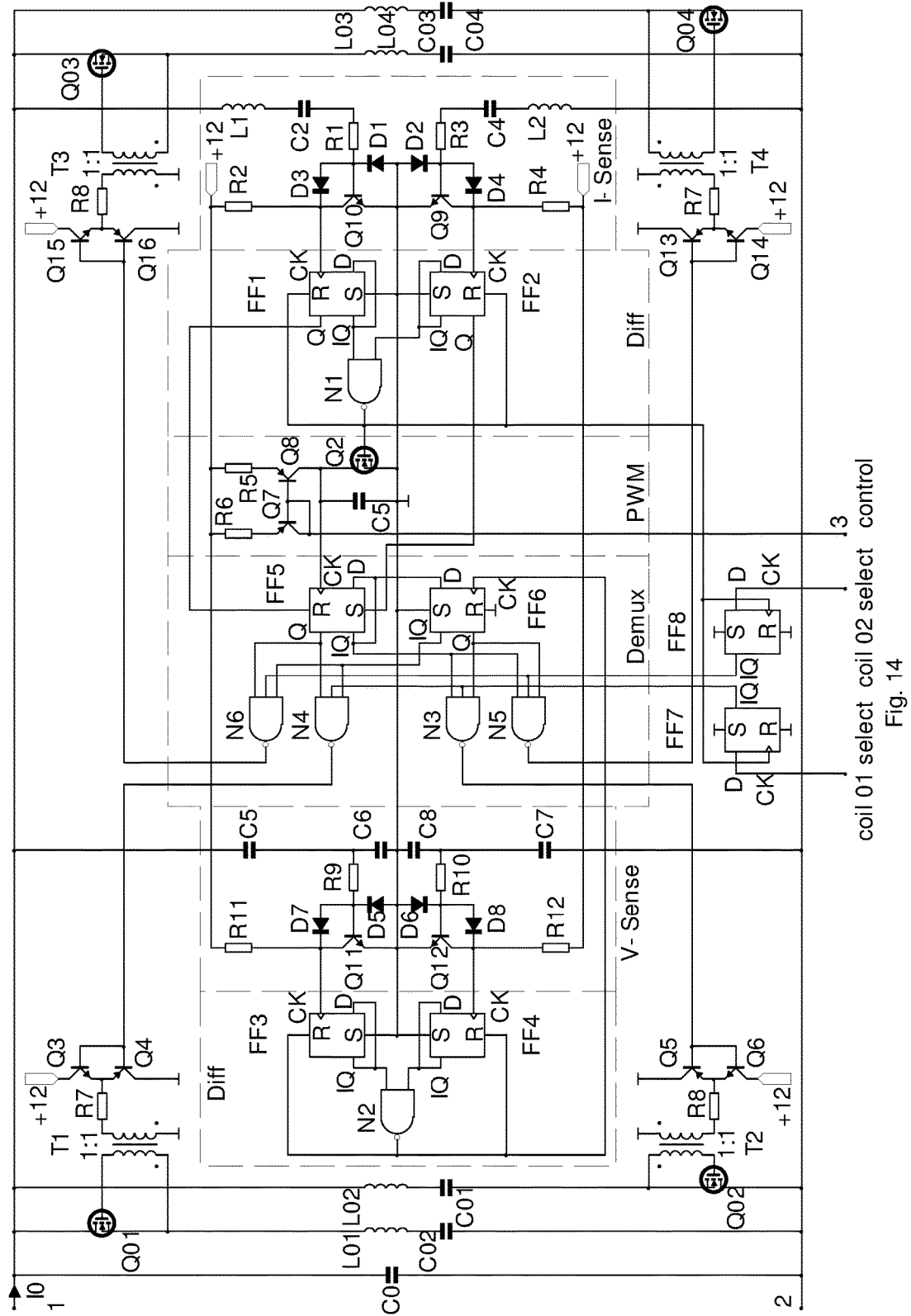
FIG. 14 shows a detailed circuit diagram of an exemplary embodiment of the invention.

FIG. 14 shows a detailed circuit of a controlled series of a capacitor and inductor according to the block diagram of FIG. 10. The dashed lines include parts of the block diagram. The oscillator coupling terminals are 1 and 2. In the further description waveforms of FIG. 11 are referenced with their indices. L01, C01, L02, C02, L03, C03 and L04, C04 are coupled to C0 via Q1 . . . Q4. The necessary coupling switch control signals 01 . . . 04, are coupled galvanically isolated from the outputs of the NAND gates N3 . . . N6 via the transformers T1 . . . T4 to the coupling switches Q01 . . . Q04. Alternatively, optocouplers are used with subsequent drivers (not shown). The NANDs N3 . . . N6 form the multiplexer, which selects the switch control outputs of flip-flops FF5 and FF6 dependent on the through FF7 and FF8 latched selection signals coil 01 select and coil 02 select. Is coil 01 select respectively coil 02 select high, the corresponding NANDs (N3, N4 respectively N5, N6) are transparent and link the outputs of FF5 and FF6 to the corresponding coupling switch pair (Q01, Q02 respectively Q03, Q04). In a further embodiment, all four inputs of the NANDs N3 . . . N6 can be independently selected by 4 control lines coil 01 select . . . coil 04 select (not shown in FIG. 12). The switch control circuit operates at a supply voltage +12 with arbitrary reference potential. The inductor L1 sense the positive current half-wave of I0 and couples it by means of the shunt resistor R13 via R1 and C2 to the base of transistor Q10. Q10 acts as a quasi zero-current detector of the positive half wave. D1 and D3 accelerate the turn off in Q10 as soon as the current in C2 changes its sign. The capacitor C2 prevents DC coupling with 10. In another embodiment, the current sense network is designed such that a phase advance results. In this manner the entire control range can be exploited.

The components of Q9, D2, D4, R3, C4 and L2 operate identically to the components of Q10, here, they are responsible for the negative current half wave of I0. The two D flip-flop FF1, FF2 and the NAND gate N1 detected the two positive edges of the output signals of the zero-current detectors Q9 and Q10. This sets alternately the output Q of a flip-flop (FF1 respectively FF2) to high, once it is triggered on the clock CK. This state is immediately reverted by the corresponding reset input after the propagation time of N1. This results in voltage pulses at the output of N1 at each zero crossing of I0 (waveform B), this closes Q2 completely for the representative short time interval. This symmetrical implementation guarantees identical behavior with respect to the two current half-waves of I0. In addition, Q2 is coupled with the current I0 only during the brief moment of the trigger event. The loopfilter control current, inserted over terminal 3 (control), charges capacitor C5 by the current mirror Q7, Q8, R6 and R5.

The result is a sawtooth voltage on C5 (curve C), whose timing of its lowest level fall together with the control pulses of Q2. This sawtooth triggers FF5 via the input CK as soon as its switching threshold is reached. This time instant can be controlled via the control input control, because the slope of the sawtooth voltage changes by the collector current in Q8 and thus varies with control. FF5, FF6, N3 and N4 form the Demux. FF5 is configured with pulses on the Set (S) respectively Reset (R) inputs that the sawtooth always becomes responsible for the corresponding switch, which is responsible for the corresponding half-wave. That represents a switching signal selection by signal A. Appears I0 with its positive half wave, D2 is conducting. The collector of Q9 is high and triggers FF2 on CK. The short appearing high pulse on output Q of FF2 sets the output Q of FF5 via its set (S) input. The high at output Q of FF5 forces a low on the outputs of N4 and N6, which opens Q1 and Q3 by the drivers Q3, Q4 respectively Q15, Q16. This is the initial condition for the controlled coupling of the series circuits L01, C01 and L03, C03 during the positive half wave of I0. If the switching threshold of the PWM modulator is reached (the voltage across C5 is equal to the threshold of FF5), FF5 toggles and its output Q is low. IQ of FF6 is also high, thus the outputs of N4 and N6 switch to high, consequently the coupling switches Q01 and Q03 are closed by the drivers Q3, Q4 respectively Q15, Q16 if coil 01 select and coil 02 select are high as well. A similar situation happens during the negative half wave of I0. The inverted output IQ of FF5 is set via the reset (R) input by FF1 when D1 is conducting and FF1 triggers on the clock CK. This forces a low on the outputs of N3 and N5, which opens Q02 and Q04 by the drivers Q5, Q6 respectively Q13, Q14. This is the initial condition for the controlled coupling of the series circuits L02, C02 and L04, C04 during the negative half wave of I0. If the switching threshold of the PWM modulator is reached (the voltage across C5 is equal to the threshold of FF5), FF5 toggles and its inverted output IQ is low. Q of FF6 is also high, thus the outputs of N3 and N5 switch to high, consequently the coupling switch Q02 and Q04 are closed by the drivers Q5, Q6 respectively Q13, Q14 if coil 01 select and coil 02 select are high as well.

The opening of the switches is controlled by Vsense and Diff. For this, the zero crossing of the voltage V0 is detected by a zero voltage sensor according to FIG. 13. The blocks V-Sense and Diff with all its components are identical in FIGS. 13 and 14 and are therefore not further explained. The pulses H at the output of N2 signal the moment at which the corresponding switches shall open again. This "turn-off command" triggers FF6 on the Clock input. Consequently the outputs of FF6 become equal to those of FF5. For the positive current half wave of I0 remain N4 and N6 on a high output level, N3 and N5 become low on their outputs. For the negative half wave of I0 remain N3 and N5 on a high output level and N4 and N6 become low on their outputs. Thus from this point (V0 zero crossing) only one of the switches Q01, Q02 respectively Q03, Q04 remain continuously closed for the corresponding half-wave of I0. Therefore, the decoupling of L01, C01 . . . L04, C04 is only determined by the integrated diodes in Q01 . . . Q04. A phase advance in the block V-Sense might no longer be absolutely necessary. The important boundary condition that the switches Q01 . . . Q04 must open before the internal diode opens must be strictly adhered. The inverted states of coil 01 select and coil 02 select are latched in the flip-flops N7 and N8 by the PWM synchronisation pulse (output of N1). In this manner, the number of operational series resonant circuits L01, C01 . . . L04, C04 in the resonant network is selected arbitrarily with a temporal resolution of half a network period.

The advantage of this differentiation (edge detection using flip-flops) is the resilience to transients, which affect only the function disruptively when the total voltage (V0) changes its sign. This makes the "turn-off command" of the switches Q01 . . . Q04 insensitive to network transients. After the circuit start-up, the flip-flop FF6 resynchronizes itself after a maximum time interval of one resonant circuit period.

In a further embodiment of the invention, the capacitors C01 . . . C04 are not implemented and replaced with bridges in the circuit of FIG. 14 (not shown). Then, the VCO of the embodiment corresponds to the multi inductor implementation in FIGS. 7 and 8.

The Controller in FIG. 12 generates pcont coilselect (containing the signals coil 01 select and coil 02 select) and fsoll according to input data, which are contained in radiationdata. Loopselect is generated from the data coilselect.

In another embodiment, loopselect is generated by using coilselect and RefDivvalue. RefDivvalue divides fref for generating fsoll.

In one embodiment, RefDivvalue remains constant in time and generates a discrete VCO spectral line (measured according to EN300330). The Controller controls this spectral line by Refdivvalue and fsoll according to data which are included in radiocontrol. Fsoll is therein constant during an energy transfer interval. An energy transfer interval is a time interval which is characterized by a radiated induction vector (measured current in a radiating coil) developing more than 1% . . . 10% of its maximal amplitude.

In another embodiment, RefDivvalue changes in time and distributes an induction vector (measured current in a radiation coil) to at least two spectral positions.

In another embodiment, RefDivvalue updates fsoll quickly and distributes an induction vector (measured current in a radiating coil) over several spectral lines or a spectral range (measured according to EN300330).

A characteristic feature of all embodiments is that the update rate in fsoll is all the time slower than the lock time of the PLL-control loop. In one embodiment, the Controller generates within a minimum and maximum bounded range a RefDivvalue which continuously changes randomly in time. These values are generated by a pseudo random sequence (PRS), and form in at least one part spectrum of the induction vector spectrum (measured current in a radiating coil) a sine(x)/x.

Figure 15A:
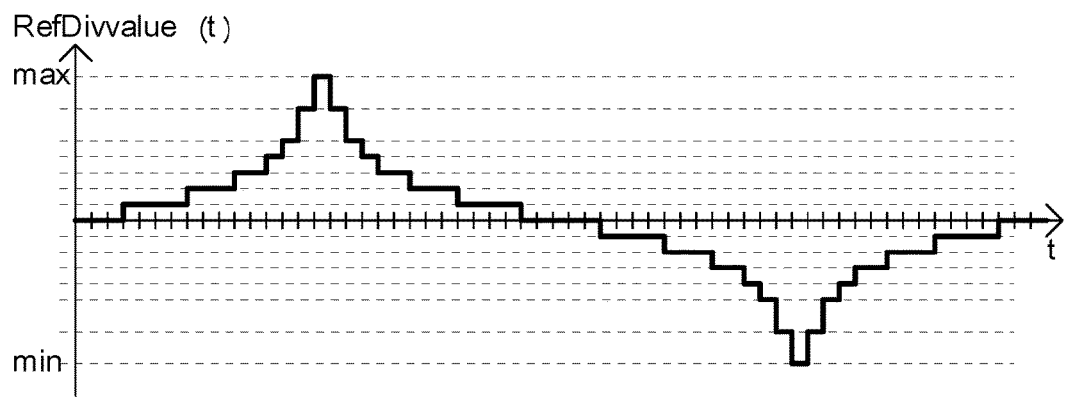
FIGS. 15A and 15B show a frequency management method according to the invention.
Figure 15B:
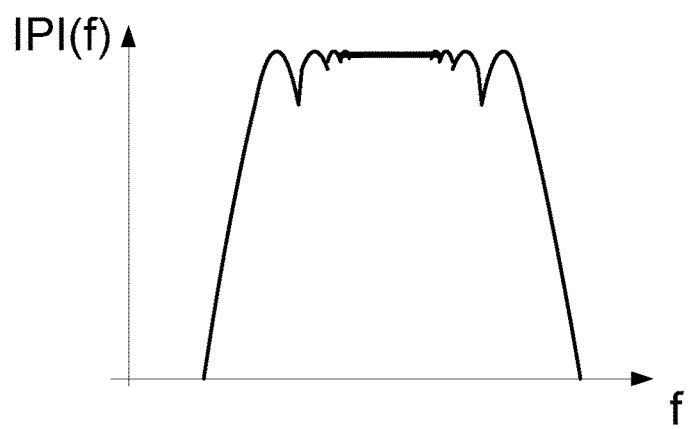

In one embodiment, the Controller generates within a minimum and maximum bounded range a RefDivvalue which continuously changes in a sweeping manner in time. A sweep sequence is characterized in that the output values periodically change from a minimum value to the maximum value and thereupon from a maximum to the minimum value and so on. FIG. 15a shows a period of such a sweep sequence (RefDivvalue(t)), wherein the residence time (time interval, where RefDivvalue remains constant) on the time axis (t) changes dynamically depending on RefDivvalue. For example, a residence time of one time unit is used for the min and max values and another residence time of five time units is used for the average of min and max. Furthermore, in one embodiment, the step value size of RefDivvalue is not constant. By means of this two described methods, as shown in FIG. 15a, a cubic function in RefDivvalue(t) can be approximated. Such a function produces a uniform spectrum, and is characterized by approximately the same maximum value $IPI_{max}(f)$ (see FIG. 15b).

Figure 16A:
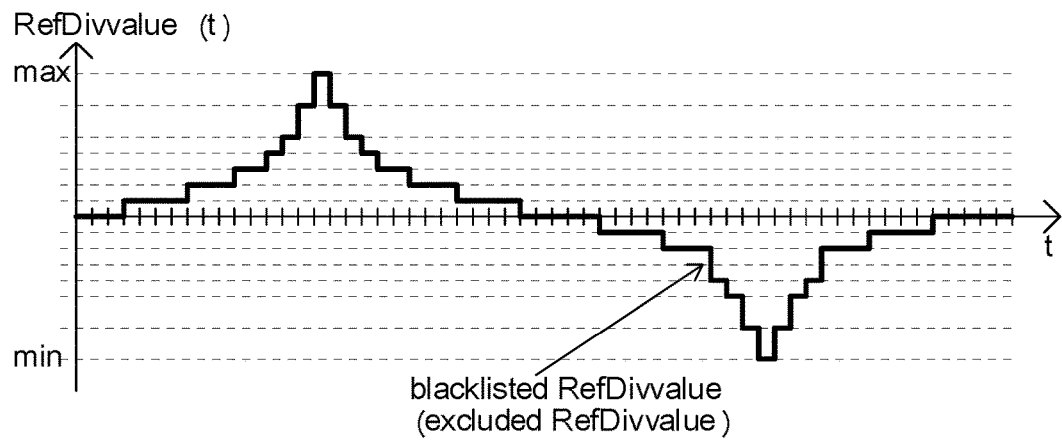
FIGS. 16A and 16B show an expanded frequency management method according to the invention.
Figure 16B:
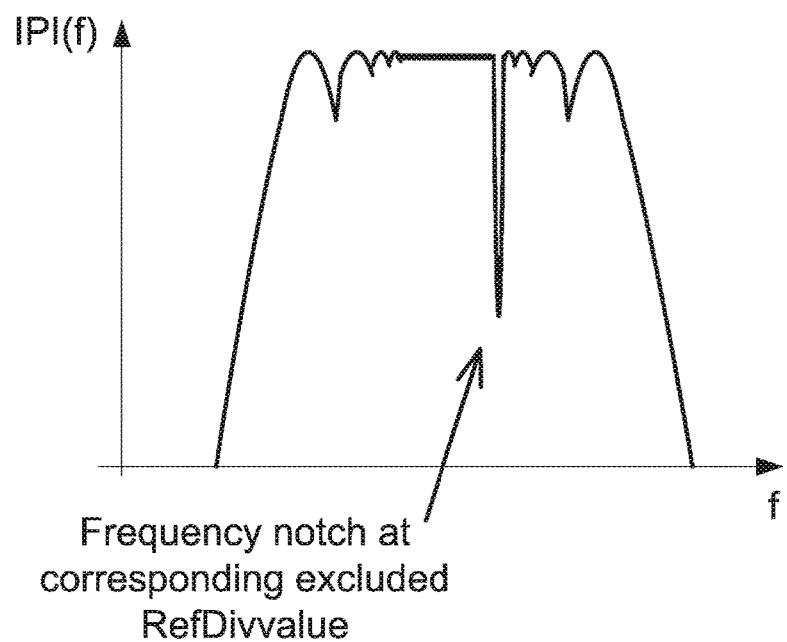

In a further embodiment not all possible RefDivvalues are assigned to form the function RefDivvalue(t). In this manner, as shown in FIG. 16a, the value of "blacklisted RefDivvalue" is excluded in the sweep sequence. Consequently, there is no frequency fsoll generated at the point fref divided by "blacklisted RefDivvalue". Therefore, no spectral component at the corresponding VCO frequency position is generated. In this way, any desired notches in $IPI_{max}(f)$ can be produced (see FIG. 16b). It is clear that this method applies to an arbitrary RefDivvalue(t) sequence, whether it is a sweep sequence or a PRS.

In one embodiment, the Controller of FIG. 12 generates pcont—and fsoll values, which give an arbitrary spectral distribution including notches (for example according to EN300330, REC7003 and ITU-RSM2123). Pcont is either determined by the power control between the base station and load unit, or if necessary by limiting maximum values as mandated by these standards. Advantageously, a memory stores appropriate RefDivvalues (min, max, and one or more blacklist RefDivvalue) as parameters. Further, a memory stores parameters for Pcont and parameters which determine the residence time of RefDivvalue(t).

The Controller can be implemented as a discrete digital network, an integrated logic circuit (PLD, FPGA) or be embodied as a microcontroller. Further, it has long been state of the art, that RAM/ROM memories (Memory) are also integrated into integrated circuits (PLD, FPGA and microcontroller with built-in memory). It is also state of the art that data input/output interfaces (for example pcont, radiationdata, coilselect and Refdivvalue) are implemented by serial- or parallel busses. In this manner, the Controller implementation can realized very compact, inexpensive and/or also according various other requirements.

All LC-based AC-generators and all existing LC-oscillator variants can be constructed with a controlled capacitor and/or a controlled inductor and/or a controlled combination circuits of the two. The term "L" stands for inductance respectively coil, and the term "C" stands for capacitance respectively capacitor. The simplest embodiment of the present invention represents an AC voltage generator with a tunable resonant network. In this embodiment, one simply eliminates the Feedback block in the FIGS. 3, 6 and 9.

The switches Qv1 and Qv2 are driven by an arbitrary external signal. The independent (decoupled from the oscillator) control signals (V1 and V2) provide a higher freedom in the generator design. This can be interesting if exact resonance tuning can be neglected or the bandwidth of the resonant circuit is very high.

For the functioning of an oscillators, it does not matter, whether the feedback (Feedback) in the oscillator is implemented by a transformer or an inductive-respectively a capacitive 3-point circuit.

It is clear that the method according to the present invention applies directly to full-bridge circuits, regardless of whether they are implemented as output stages or oscillators.

Another embodiment of the present invention combines multiple VCOs implemented according to the current invention, which operate in a combined manner to induction coils.

Since the current phasing, respectively, the voltage phasing in the resonant circuit of the VCOs are well defined, induction field superposition is particularly easy to realise using the current invention.

The invention claimed is:

1. A method of generating at least one of an alternation voltage and current in a resonant circuit including at least one first capacitor, at least one first inductor and at least one reactive component, said method comprising:
   generating, for at least an energization time interval, at least one of a continuous voltage and current in said resonant circuit,
   coupling said at least one reactive component to at least one of said at least one first capacitor and said at least one first inductor for a variable coupling interval within a resonant circuit period, and
   varying said variable coupling interval as a function of time for distributing an average frequency of said at least one of the continuous voltage and current in said resonant circuit or a radiated field therefrom over a frequency range between a minimal frequency and a maximal frequency wherein said frequency range includes at least one frequency notch.

2. The method according to claim 1, wherein the average frequency of said at least one of the continuous voltage and current in said resonant circuit or radiated field therefrom resides temporally shorter at said minimal and maximal frequency than at an average frequency of said minimal and maximal frequency.

3. The method according to claim 1, wherein said variable coupling interval is a variable ON/OFF interval for establishing at least one of a resonance frequency, impedance and admittance variation in said resonant circuit and said at least one reactive component is at least one of:
   a second inductor,
   a second capacitor, and
   a serial circuit formed by a third inductor and a third capacitor.

4. The method according to claim 1, further comprising:
   controlling an amplitude of at least one of said continuous voltage and current in said resonant circuit for controlling power transfer to a load unit coupled via nearfield coupling with said resonant circuit.

5. The method according to claim 1, further comprising:
   comparing at least one of a phase or frequency information of at least one of said continuous voltage and current in said resonant circuit versus a reference frequency, and
   adjusting said variable coupling interval responsive to a filtered output of said comparison.

6. The method according to claim 5, further comprising:
   varying said reference frequency as a function of time for distributing the average frequency of said at least one of the continuous voltage and current in said resonant circuit or radiated field therefrom over at least two discrete spectral lines, a sin(x)/(x) or a frequency range between the minimal frequency and the maximal frequency wherein said at least one of said two discrete spectral lines, sin(x)/(x) and frequency range includes at least one frequency notch or frequencies where no average frequencies of said voltage or current in said resonant circuit or radiated field therefrom is generated.

7. The method according to claim 1, wherein said generating further comprises:
   driving said resonant circuit responsive to at least one of the continuous voltage and current of said resonant circuit in a positive feedback manner to enable a continuous voltage and current oscillation in said resonant circuit.

8. The method according to claim 5, further comprising:
dividing a constant reference frequency as a function of time to obtain said reference frequency wherein said dividing excludes at least one dividing value at a corresponding notch frequency or excludes values to fulfill standardized field emission requirements in said at least one of the continuous voltage and current in said resonant circuit or radiated field therefrom.

9. An apparatus for generating at least one of an alternation voltage and current in a resonant network comprising:
at least one active component for generating at least one of a continuous voltage and current for at least one first time interval in a resonant circuit including at least one first capacitor and at least one first inductor,
at least one reactive component coupled to at least one of said at least one first capacitor and said at least one first inductor by at least one coupling component for a variable coupling interval within a resonant circuit period, and
a coupling control circuit for varying said variable coupling interval of said at least one reactive component in time for distributing an average frequency of said at least one of the continuous voltage and current in resonant circuit or a radiated field therefrom over a frequency range between a minimal frequency and a maximal frequency wherein said frequency range includes at least one frequency notch.

10. The apparatus according to claim 9, wherein the average frequency of said at least one of the continuous voltage and current in said resonant circuit or radiated field therefrom resides temporally shorter at said minimal and maximal frequency than at the average frequency of said minimal and maximal frequency.

11. The apparatus according to claim 9, wherein said variable coupling interval is a variable ON/OFF interval and establishes at least one of a resonance frequency, impedance or admittance variation in said resonant circuit and said reactive component is at least one of:
a second inductor,
a second capacitor, and
a serial circuit formed by a third inductor and a third capacitor.

12. The apparatus according to claim 9, further comprising:
an amplitude control circuit for controlling an amplitude of at least one of the continuous voltage and current in said resonant circuit for controlling power transfer to a load unit coupled via nearfield coupling with said resonant circuit.

13. The apparatus according to claim 9, further comprising:
a comparator for comparing at least one of a phase or frequency information of at least one of the continuous voltage or current in said resonant circuit versus a reference frequency, wherein said variable coupling interval is responsive to a filtered output of said comparator.

14. The apparatus according to claim 13, wherein said reference frequency varies as a function of time for distributing the average frequency of said at least one continuous voltage and current in said resonant circuit or radiated field therefrom to form at least two discrete spectral lines, a sin(x)/(x) or a frequency range between a minimal frequency and a maximal frequency wherein said at least two discrete spectral lines, said sin(x)/(x) or said frequency range includes at least one frequency notch or frequencies where no average frequencies of said at least one of said continuous voltage or current in said resonant circuit or radiated field therefrom is generated.

15. The apparatus according to claim 13, further comprising:
a frequency divider for dividing a constant reference frequency as a function of time to obtain said reference frequency wherein said frequency divider excludes at least one dividing value at a corresponding notch frequency or excludes values to fulfill standardized field emission requirements in said at least one of said continuous voltage and current in said resonant circuit or radiated field therefrom.

16. The apparatus according to claim 9, wherein said at least one active component and said resonant circuit form an oscillator for generating said at least one of the alternation voltage and current in said resonant circuit.

17. A transmitter for wirelessly transmitting electrical power from a source unit to a load unit based on nearfield coupling comprising:
a) at least one active component controlled by one of an alternation voltage and an alternation current,
b) a resonant circuit coupled to said at least one active component, said resonance circuit including at least a first inductor and at least a first capacitor, wherein said nearfield coupling between said source unit and said load unit is established by coupling at least a part of said resonant circuit with said load unit,
c) at least one reactive component,
d) at least one switch coupling said at least one reactive component to said resonant circuit, wherein said at least one reactive component is charged and discharged by said resonant circuit and said switch alters its state at least once within a resonant circuit period,
e) a power control circuit responsive to a control signal for controlling power transfer from said source unit to said load unit via at least one of a voltage and current in said resonant circuit, and
f) a control circuit for controlling said switch such that the average frequency of said at least one voltage and current in said resonant circuit or a radiated field therefrom is distributed over at least two spectral lines, wherein said at least two spectral lines includes at least one frequency notch.

18. The transmitter according to claim 17, wherein said switch is controlled such that the average frequency of said at least one voltage and current in said resonant circuit or radiated field therefrom forms at least two discrete spectral lines, a sin(x)/(x) or a frequency range between a minimal frequency and a maximal frequency and wherein said at least two discrete spectral lines, said sin(x)/(x) or said frequency range includes at least one frequency notch or frequencies where no average frequency of said at least one voltage and current in said resonant circuit or radiated field therefrom is generated.

19. The transmitter according to claim 17, wherein said switch couples said reactive component to said resonant circuit by a variable ON/OFF interval and establishes one of a resonance frequency, impedance or admittance variation in said resonant circuit and said reactive component is at least one of:
a second inductor,
a second capacitor, and
a serial circuit formed by a third inductor and a third capacitor.

20. The transmitter according to claim 17, wherein said at least one active component and said resonant circuit form an oscillator.

21. The transmitter according to claim 17, wherein said resonant circuit, said at least one reactive component, said switch and said control circuit are part of a Phase Lock Loop (PLL) for locking said resonant circuit voltage or current to a reference frequency.

22. The transmitter according to claim 21, wherein said reference frequency varies as a function of time for distributing the average frequency of said at least one voltage or current in said resonant circuit or radiated field therefrom to form at least two discrete spectral lines, a $\sin(x)/(x)$ or a frequency range between a minimal frequency and a maximal frequency and wherein said at least two discrete spectral lines, said $\sin(x)/(x)$ or said frequency range includes at least one frequency notch or frequencies where no average frequency of said voltage or current in said resonant circuit or radiated field therefrom is generated.

23. The transmitter according to claim 17, wherein said at least two spectral lines in the average frequency of said voltage or current in said resonant circuit or radiated field therefrom are generated by a frequency divider which excludes at least one dividing value where at least one frequency notch or frequencies where no spectral positions in the average frequency of said voltage or current in said resonant circuit or radiated field therefrom is generated.

* * * * *